United States Patent
Nguyen et al.

(10) Patent No.: US 11,843,067 B2
(45) Date of Patent: Dec. 12, 2023

(54) PHOTOVOLTAIC MODULES

(71) Applicant: GAF Energy LLC, Parsippany, NJ (US)

(72) Inventors: Thierry Nguyen, San Francisco, CA (US); Brian Atchley, Petaluma, CA (US); Lewis Abra, San Francisco, CA (US); Jonathan Hewlett, Novato, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 17/382,004

(22) Filed: Jul. 21, 2021

(65) Prior Publication Data

US 2022/0029037 A1    Jan. 27, 2022

Related U.S. Application Data

(60) Provisional application No. 63/191,165, filed on May 20, 2021, provisional application No. 63/082,725, (Continued)

(51) Int. Cl.
  *H01L 31/048* (2014.01)
  *H02S 40/36* (2014.01)
  *H01L 31/02* (2006.01)

(52) U.S. Cl.
  CPC ...... *H01L 31/048* (2013.01); *H01L 31/02008* (2013.01); *H02S 40/36* (2014.12)

(58) Field of Classification Search
  CPC ......... H01L 31/02008; H01L 31/02013; H01L 31/048; H02S 20/25; H02S 40/36; H02S 40/34
  See application file for complete search history.

(56) References Cited

U.S. PATENT DOCUMENTS 1,981,467 A    11/1934  Radtke
3,156,497 A    11/1964  Lessard
(Continued)

FOREIGN PATENT DOCUMENTS

CA    2829440 A1    4/2014
CA    2829440 C     5/2019
(Continued)

OTHER PUBLICATIONS

Sunflare, Procducts: "Sunflare Develops Prototype for New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — Niki Bakhtiari
(74) *Attorney, Agent, or Firm* — GREENBERG TRAURIG, LLP

(57) ABSTRACT

A system includes a photovoltaic module including at least one solar cell with electrical bussing, an encapsulant encapsulating the at least one solar cell and having a first surface with a first opening, and a frontsheet juxtaposed with the first surface of the encapsulant. The frontsheet includes a second opening extending from a first surface to a second surface thereof. The second opening of the frontsheet is in fluid communication with the first opening of the encapsulant. The electrical bussing is positioned in the first opening. An electrical wire is connected to the electrical bussing through the first and second openings. A cover is attached to the frontsheet and covers one end of the electrical wire and the first and second openings.

5 Claims, 20 Drawing Sheets

Related U.S. Application Data filed on Sep. 24, 2020, provisional application No. 63/055,161, filed on Jul. 22, 2020.

(56) References Cited

U.S. PATENT DOCUMENTS

| | | |
|---|---|---|
| 4,258,948 A | 3/1981 | Hoffmann |
| 4,349,220 A | 9/1982 | Carroll et al. |
| 4,499,702 A | 2/1985 | Turner |
| 4,636,577 A | 1/1987 | Peterpaul |
| 5,167,579 A | 12/1992 | Rotter |
| 5,437,735 A | 8/1995 | Younan et al. |
| 5,590,495 A | 1/1997 | Bressler et al. |
| 5,642,596 A | 7/1997 | Waddington |
| 6,008,450 A | 12/1999 | Ohtsuka et al. |
| 6,033,270 A | 3/2000 | Stuart |
| 6,046,399 A | 4/2000 | Kapner |
| 6,320,114 B1 | 11/2001 | Kuechler |
| 6,320,115 B1 | 11/2001 | Kataoka et al. |
| 6,336,304 B1 | 1/2002 | Mimura et al. |
| 6,341,454 B1 | 1/2002 | Koleoglou |
| 6,407,329 B1 | 6/2002 | Iino et al. |
| 6,576,830 B2 | 6/2003 | Nagao et al. |
| 6,928,781 B2 | 8/2005 | Desbois et al. |
| 6,972,367 B2 | 12/2005 | Federspiel et al. |
| 7,138,578 B2 | 11/2006 | Komamine |
| 7,155,870 B2 | 1/2007 | Almy |
| 7,178,295 B2 | 2/2007 | Dinwoodie |
| 7,487,771 B1 | 2/2009 | Eiffert et al. |
| 7,587,864 B2 | 9/2009 | McCaskill et al. |
| 7,666,491 B2 | 2/2010 | Yang et al. |
| 7,678,990 B2 | 3/2010 | McCaskill et al. |
| 7,678,991 B2 | 3/2010 | McCaskill et al. |
| 7,748,191 B2 | 7/2010 | Podirsky |
| 7,819,114 B2 | 10/2010 | Augenbraun et al. |
| 7,824,191 B1 | 11/2010 | Browder |
| 7,832,176 B2 | 11/2010 | McCaskill et al. |
| 8,118,109 B1 | 2/2012 | Hacker |
| 8,168,880 B2 | 5/2012 | Jacobs et al. |
| 8,173,889 B2 | 5/2012 | Kalkanoglu et al. |
| 8,210,570 B1 | 7/2012 | Railkar et al. |
| 8,276,329 B2 | 10/2012 | Lenox |
| 8,312,693 B2 | 11/2012 | Cappelli |
| 8,319,093 B2 | 11/2012 | Kalkanoglu et al. |
| 8,333,040 B2 | 12/2012 | Shiao et al. |
| 8,371,076 B2 | 2/2013 | Jones et al. |
| 8,375,653 B2 | 2/2013 | Shiao et al. |
| 8,404,967 B2 | 3/2013 | Kalkanoglu et al. |
| 8,410,349 B2 | 4/2013 | Kalkanoglu et al. |
| 8,418,415 B2 | 4/2013 | Shiao et al. |
| 8,438,796 B2 | 5/2013 | Shiao et al. |
| 8,468,754 B2 | 6/2013 | Railkar et al. |
| 8,468,757 B2 | 6/2013 | Krause et al. |
| 8,505,249 B2 | 8/2013 | Geary |
| 8,512,866 B2 | 8/2013 | Taylor |
| 8,513,517 B2 | 8/2013 | Kalkanoglu et al. |
| 8,586,856 B2 | 11/2013 | Kalkanoglu et al. |
| 8,601,754 B2 | 12/2013 | Jenkins et al. |
| 8,623,499 B2 | 1/2014 | Viasnoff |
| 8,629,578 B2 | 1/2014 | Kurs et al. |
| 8,646,228 B2 | 2/2014 | Jenkins |
| 8,656,657 B2 | 2/2014 | Livsey et al. |
| 8,671,630 B2 | 3/2014 | Lena et al. |
| 8,677,702 B2 | 3/2014 | Jenkins |
| 8,695,289 B2 | 4/2014 | Koch et al. |
| 8,713,858 B1 | 5/2014 | Xie |
| 8,713,860 B2 | 5/2014 | Railkar et al. |
| 8,733,038 B2 | 5/2014 | Kalkanoglu et al. |
| 8,789,321 B2 | 7/2014 | Ishida |
| 8,793,940 B2 | 8/2014 | Kalkanoglu et al. |
| 8,793,941 B2 | 8/2014 | Bosler et al. |
| 8,826,607 B2 | 9/2014 | Shiao et al. |
| 8,835,751 B2 | 9/2014 | Kalkanoglu et al. |
| 8,863,451 B2 | 10/2014 | Jenkins et al. |
| 8,898,970 B2 | 12/2014 | Jenkins et al. |
| 8,925,262 B2 | 1/2015 | Railkar et al. |
| 8,943,766 B2 | 2/2015 | Gombarick et al. |
| 8,946,544 B2 | 2/2015 | Jacobs et al. |
| 8,950,128 B2 | 2/2015 | Kalkanoglu et al. |
| 8,959,848 B2 | 2/2015 | Jenkins et al. |
| 8,966,838 B2 | 3/2015 | Jenkins |
| 8,966,850 B2 | 3/2015 | Jenkins et al. |
| 8,994,224 B2 | 3/2015 | Mehta et al. |
| 9,032,672 B2 | 5/2015 | Livsey et al. |
| 9,145,498 B2 | 9/2015 | Ultsch |
| 9,166,087 B2 | 10/2015 | Chihlas et al. |
| 9,169,646 B2 | 10/2015 | Rodrigues et al. |
| 9,170,034 B2 | 10/2015 | Bosler et al. |
| 9,171,991 B2 | 10/2015 | Pearce |
| 9,178,465 B2 | 11/2015 | Shiao et al. |
| 9,202,955 B2 | 12/2015 | Livsey et al. |
| 9,212,832 B2 | 12/2015 | Jenkins |
| 9,217,584 B2 | 12/2015 | Kalkanoglu et al. |
| 9,270,221 B2 | 2/2016 | Zhao |
| 9,273,885 B2 | 3/2016 | Rodrigues et al. |
| 9,276,141 B2 | 3/2016 | Kalkanoglu et al. |
| 9,331,224 B2 | 5/2016 | Koch et al. |
| 9,356,174 B2 | 5/2016 | Duarte et al. |
| 9,359,014 B1 | 6/2016 | Yang et al. |
| 9,412,890 B1 | 8/2016 | Meyers |
| 9,528,270 B2 | 12/2016 | Jenkins et al. |
| 9,605,432 B1 | 3/2017 | Robbins |
| 9,670,353 B2 | 6/2017 | Peng et al. |
| 9,711,672 B2 | 7/2017 | Wang |
| 9,711,991 B2 | 7/2017 | Hall et al. |
| 9,755,573 B2 | 9/2017 | Livsey et al. |
| 9,786,802 B2 | 10/2017 | Shiao et al. |
| 9,831,818 B2 | 11/2017 | West |
| 9,912,284 B2 | 3/2018 | Svec |
| 9,920,515 B2 | 3/2018 | Xing et al. |
| 9,923,515 B2 | 3/2018 | Rodrigues et al. |
| 9,938,729 B2 | 4/2018 | Coon |
| 9,987,786 B2 | 6/2018 | Stoiljkovic et al. |
| 9,991,412 B2 | 6/2018 | Gonzalez et al. |
| 9,998,067 B2 | 6/2018 | Kalkanoglu et al. |
| 10,015,933 B2 | 7/2018 | Boldrin |
| 10,027,273 B2 | 7/2018 | West et al. |
| 10,115,850 B2 | 10/2018 | Rodrigues et al. |
| 10,128,660 B1 | 11/2018 | Apte et al. |
| 10,156,075 B1 | 12/2018 | McDonough |
| 10,179,852 B2 | 1/2019 | Gossi et al. |
| 10,187,005 B2 | 1/2019 | Rodrigues et al. |
| 10,256,765 B2 | 4/2019 | Rodrigues et al. |
| 10,284,136 B1 | 5/2019 | Mayfield et al. |
| 10,454,408 B2 | 10/2019 | Livsey et al. |
| 10,480,192 B2 | 11/2019 | Xing et al. |
| 10,530,292 B1 | 1/2020 | Cropper et al. |
| 10,560,048 B2 | 2/2020 | Fisher et al. |
| 10,563,406 B2 | 2/2020 | Kalkanoglu et al. |
| D879,031 S | 3/2020 | Lance et al. |
| 10,669,414 B2 | 6/2020 | Li et al. |
| 10,784,813 B2 | 9/2020 | Kalkanoglu et al. |
| D904,289 S | 12/2020 | Lance et al. |
| 10,907,355 B2 | 2/2021 | Hubbard et al. |
| 10,914,063 B2 | 2/2021 | Lee et al. |
| RE48,555 E | 5/2021 | Cancio et al. |
| 11,012,026 B2 | 5/2021 | Kalkanoglu et al. |
| 11,015,085 B2 | 5/2021 | Bruns et al. |
| 11,065,849 B2 | 7/2021 | Ackermann et al. |
| 11,177,639 B1 | 11/2021 | Nguyen et al. |
| 11,217,715 B2 | 1/2022 | Sharenko et al. |
| 11,251,744 B1 | 2/2022 | Bunea et al. |
| 11,258,399 B2 | 2/2022 | Kalkanoglu et al. |
| 11,283,394 B2 | 3/2022 | Perkins et al. |
| 11,424,379 B2 | 8/2022 | Sharenko et al. |
| 11,431,280 B2 | 8/2022 | Liu et al. |
| 11,431,281 B2 | 8/2022 | Perkins et al. |
| 2002/0053360 A1 | 5/2002 | Kinoshita et al. |
| 2002/0102422 A1 | 8/2002 | Hubbard et al. |
| 2002/0129849 A1 | 9/2002 | Heckeroth |
| 2003/0101662 A1 | 6/2003 | Ullman |
| 2003/0132265 A1 | 7/2003 | Villela et al. |
| 2003/0217768 A1 | 11/2003 | Guha |
| 2005/0030187 A1 | 2/2005 | Peress et al. |
| 2005/0115603 A1 | 6/2005 | Yoshida et al. |

(56) References Cited

U.S. PATENT DOCUMENTS

| | | |
|---|---|---|
| 2005/0144870 A1 | 7/2005 | Dinwoodie |
| 2005/0178428 A1 | 8/2005 | Laaly et al. |
| 2006/0042683 A1 | 3/2006 | Gangemi |
| 2006/0046084 A1 | 3/2006 | Yang et al. |
| 2007/0181174 A1 | 8/2007 | Ressler |
| 2007/0193618 A1 | 8/2007 | Bressler et al. |
| 2007/0249194 A1 | 10/2007 | Liao |
| 2007/0295385 A1 | 12/2007 | Sheats et al. |
| 2008/0006323 A1 | 1/2008 | Kalkanoglu et al. |
| 2008/0035140 A1 | 2/2008 | Placer et al. |
| 2008/0315061 A1 | 2/2008 | Placer et al. |
| 2008/0078440 A1* | 4/2008 | Lim .................. H01R 4/28 136/251 |
| 2008/0185748 A1 | 8/2008 | Kalkanoglu |
| 2008/0271774 A1 | 11/2008 | Kalkanoglu et al. |
| 2008/0302030 A1 | 12/2008 | Stancel et al. |
| 2009/0000222 A1 | 1/2009 | Kalkanoglu et al. |
| 2009/0014058 A1 | 1/2009 | Croft et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |
| 2009/0159118 A1 | 6/2009 | Kalkanoglu |
| 2009/0178350 A1 | 7/2009 | Kalkanoglu et al. |
| 2009/0229652 A1 | 9/2009 | Mapel et al. |
| 2010/0019580 A1 | 1/2010 | Croft et al. |
| 2010/0095618 A1 | 4/2010 | Edison et al. |
| 2010/0101634 A1 | 4/2010 | Frank et al. |
| 2010/0116325 A1 | 5/2010 | Nikoonahad |
| 2010/0131108 A1 | 5/2010 | Meyer |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0170169 A1 | 7/2010 | Railkar et al. |
| 2010/0242381 A1 | 9/2010 | Jenkins |
| 2010/0313499 A1 | 12/2010 | Gangemi |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0036386 A1 | 2/2011 | Browder |
| 2011/0036389 A1 | 2/2011 | Hardikar et al. |
| 2011/0048507 A1 | 3/2011 | Livsey et al. |
| 2011/0058337 A1 | 3/2011 | Han |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0168238 A1* | 7/2011 | Metin .................. H01L 31/046 136/251 |
| 2011/0239555 A1 | 10/2011 | Cook et al. |
| 2011/0302859 A1 | 12/2011 | Crasnianski |
| 2012/0034799 A1 | 2/2012 | Hunt |
| 2012/0037203 A1 | 2/2012 | Sainoo et al. |
| 2012/0060902 A1 | 3/2012 | Drake |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2012/0291848 A1 | 11/2012 | Sherman et al. |
| 2013/0008499 A1 | 1/2013 | Verger et al. |
| 2013/0014455 A1 | 1/2013 | Grieco |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0182222 A1 | 7/2014 | Kalkanoglu et al. |
| 2014/0254776 A1 | 9/2014 | O'Connor et al. |
| 2014/0266289 A1 | 9/2014 | Della Sera et al. |
| 2014/0311556 A1 | 10/2014 | Feng et al. |
| 2014/0352753 A1 | 12/2014 | DeGroot et al. |
| 2014/0352760 A1 | 12/2014 | Haynes et al. |
| 2014/0366464 A1 | 12/2014 | Rodrigues et al. |
| 2015/0024159 A1 | 1/2015 | Bess et al. |
| 2015/0089895 A1 | 4/2015 | Leitch |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0142008 A1 | 5/2016 | Lopez et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179319 A1 | 6/2017 | Yamashita et al. |
| 2017/0179726 A1 | 6/2017 | Garrity et al. |
| 2017/0203555 A1 | 7/2017 | Wang et al. |
| 2017/0237390 A1 | 8/2017 | Hudson et al. |
| 2017/0331415 A1 | 11/2017 | Koppi et al. |
| 2018/0091092 A1 | 3/2018 | Hall et al. |
| 2018/0094438 A1 | 4/2018 | Wu et al. |
| 2018/0094439 A1 | 4/2018 | Wang et al. |
| 2018/0097472 A1 | 4/2018 | Anderson et al. |
| 2018/0115275 A1 | 4/2018 | Flanigan et al. |
| 2018/0243822 A1 | 8/2018 | Wagstaff |
| 2018/0254738 A1* | 9/2018 | Yang .................. H02S 30/00 |
| 2018/0281347 A1 | 10/2018 | Gossi |
| 2018/0351502 A1 | 12/2018 | Almy et al. |
| 2018/0367089 A1 | 12/2018 | Stutterheim et al. |
| 2019/0030867 A1 | 1/2019 | Sun et al. |
| 2019/0081436 A1 | 3/2019 | Onodi et al. |
| 2019/0123679 A1 | 4/2019 | Rodrigues et al. |
| 2019/0253022 A1 | 8/2019 | Hardar et al. |
| 2019/0305717 A1 | 10/2019 | Allen et al. |
| 2020/0020819 A1 | 1/2020 | Farhangi |
| 2020/0109320 A1 | 4/2020 | Jiang |
| 2020/0144958 A1 | 5/2020 | Rodrigues et al. |
| 2020/0144968 A1 | 5/2020 | Maalouf et al. |
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0002898 A1 | 1/2021 | Knebel et al. |
| 2021/0095474 A1 | 4/2021 | Yang et al. |
| 2021/0113970 A1 | 4/2021 | Stainer et al. |
| 2021/0115223 A1 | 4/2021 | Bonekamp et al. |
| 2021/0159353 A1 | 5/2021 | Li et al. |
| 2021/0171808 A1 | 6/2021 | Ackermann et al. |
| 2021/0172174 A1 | 6/2021 | Ackermann et al. |
| 2021/0343886 A1 | 11/2021 | Sharenko et al. |
| 2022/0149213 A1 | 5/2022 | Mensink et al. |

FOREIGN PATENT DOCUMENTS

| | | |
|---|---|---|
| CH | 700095 A2 | 6/2010 |
| CN | 202797032 U | 3/2013 |
| DE | 1958248 A1 | 11/1971 |
| EP | 1039361 A1 | 9/2000 |
| EP | 1837162 A1 | 9/2007 |
| EP | 1774372 A1 | 7/2011 |
| EP | 2446481 A2 | 5/2012 |
| EP | 2784241 A1 | 10/2014 |
| JP | 10046767 A | 2/1998 |
| JP | 2001-098703 A | 4/2001 |
| JP | 2002-106151 A | 4/2002 |
| JP | 2012-142634 A | 7/2012 |
| JP | 2017-027735 A | 2/2017 |
| JP | 2018053707 A | 4/2018 |
| KR | 20090084060 A | 8/2009 |
| KR | 10-2019-0000367 A | 1/2019 |
| KR | 110-2253483 B1 | 5/2021 |
| NL | 2026856 B1 | 6/2022 |
| WO | 2011/049944 A1 | 4/2011 |
| WO | 2015/133632 A1 | 9/2015 |
| WO | 2019/201416 A1 | 10/2019 |

(56) References Cited

FOREIGN PATENT DOCUMENTS

| WO | 2020-159358 A1 | 8/2020 |
| WO | 2021-247098 A1 | 12/2021 |

OTHER PUBLICATIONS

RGS Energy, 3.5kW Powerhouse 3.0 system installed in an afternoon; Jun. 7, 2019 <<facebook.com/RGSEnergy/>> retrieved Feb. 2, 2021.
Tesla, Solar Roof <<tesla.com/solarroof>> retrieved Feb. 2, 2021.
"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

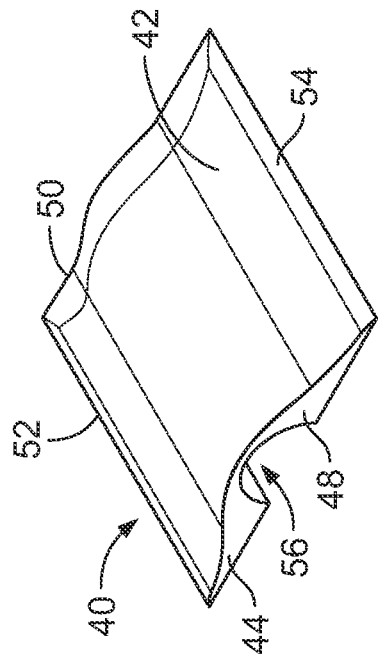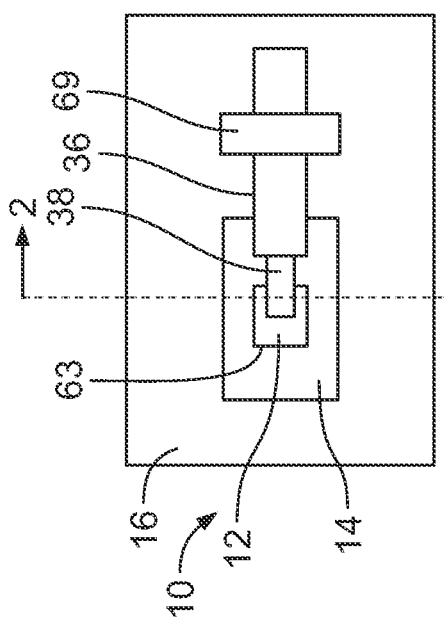

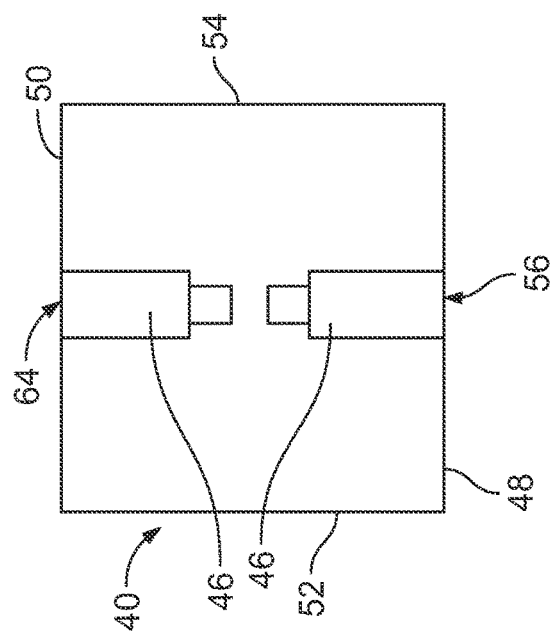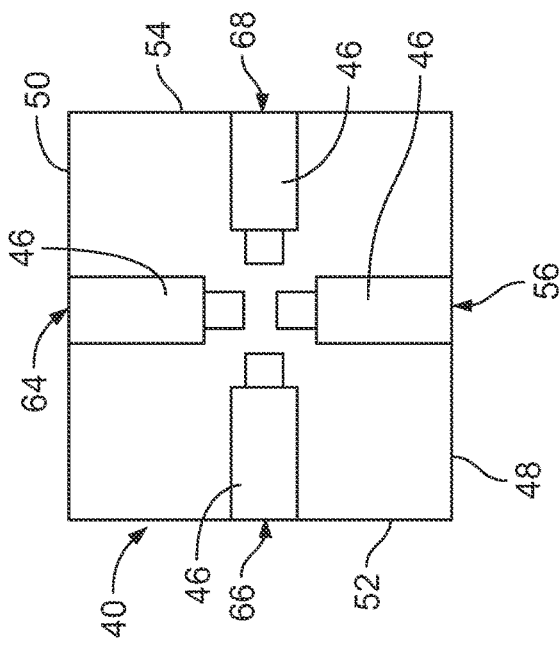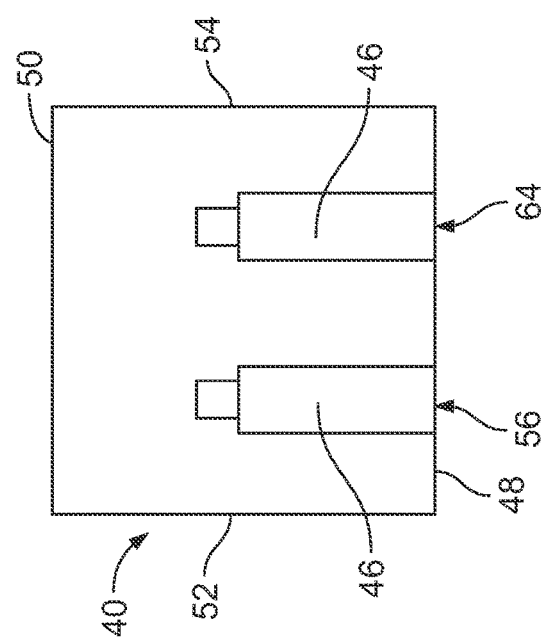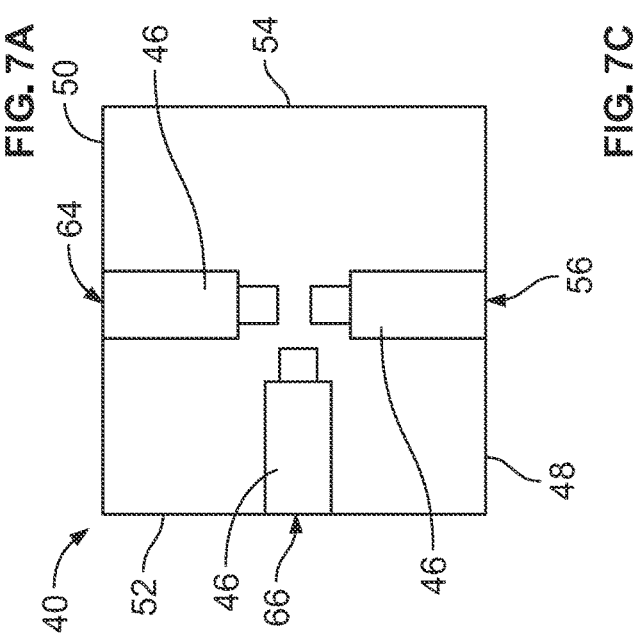

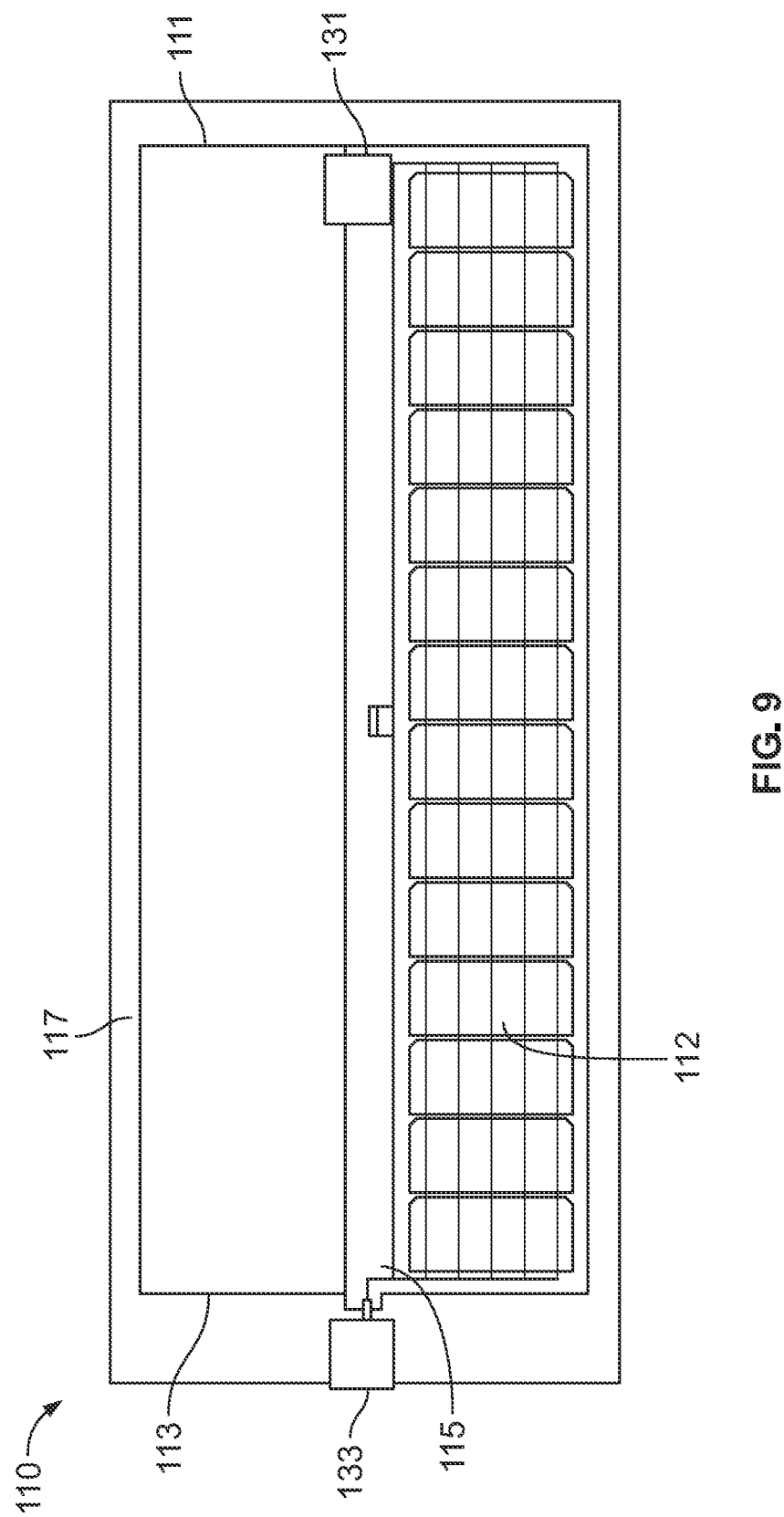

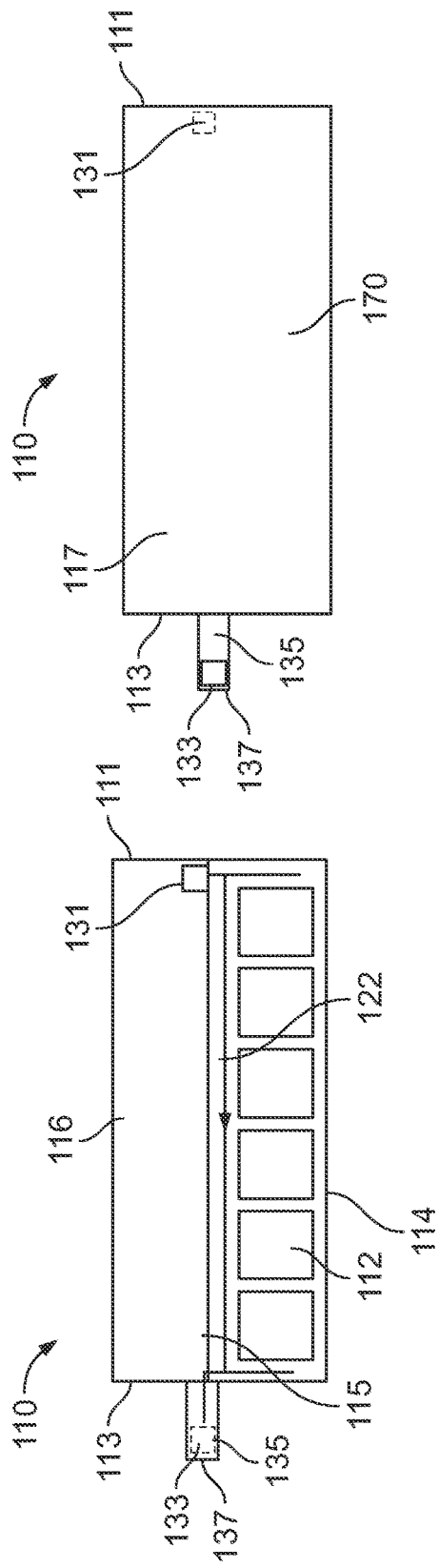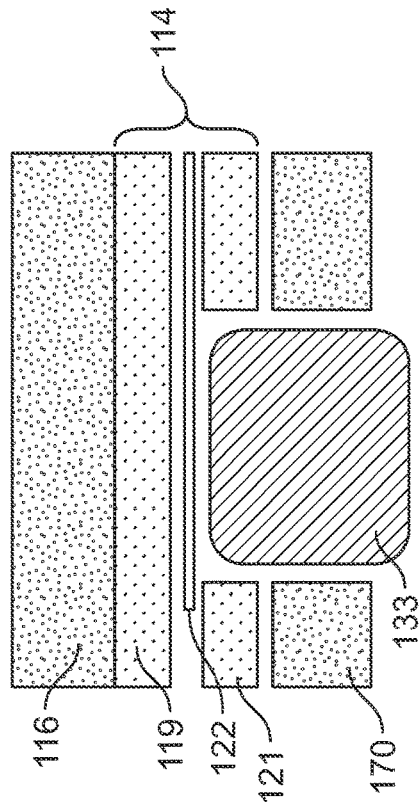

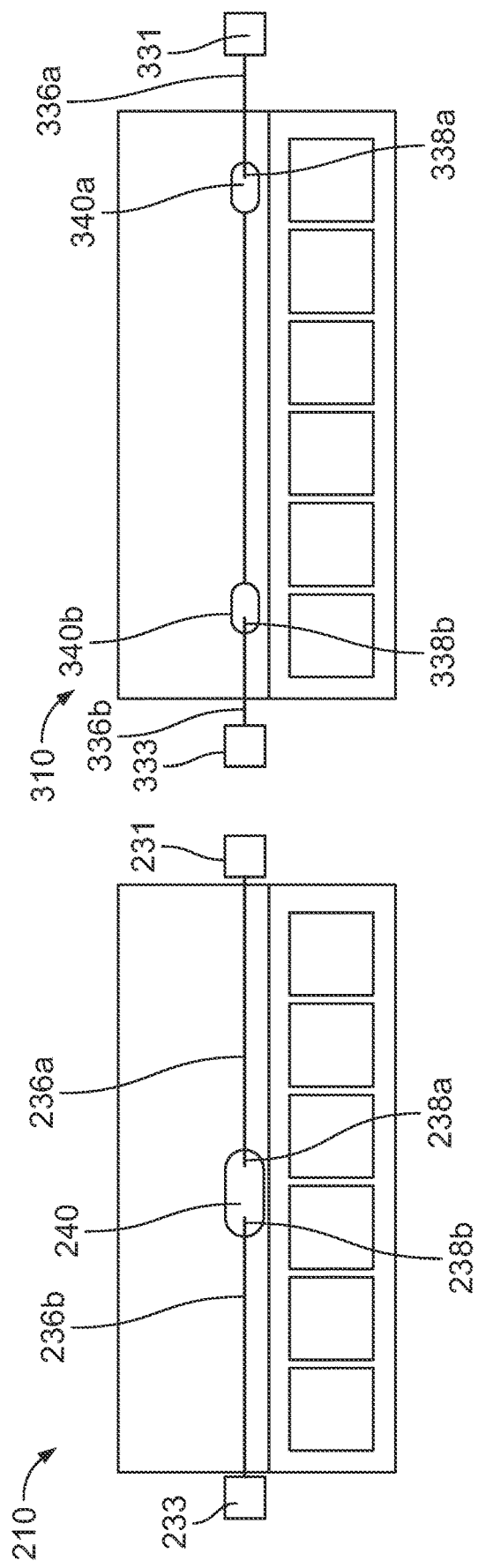
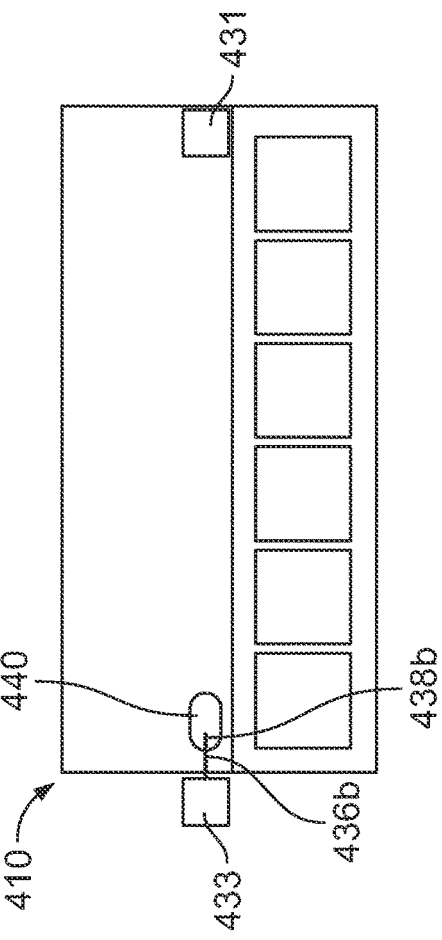
FIG. 16A
FIG. 16B
FIG. 16C

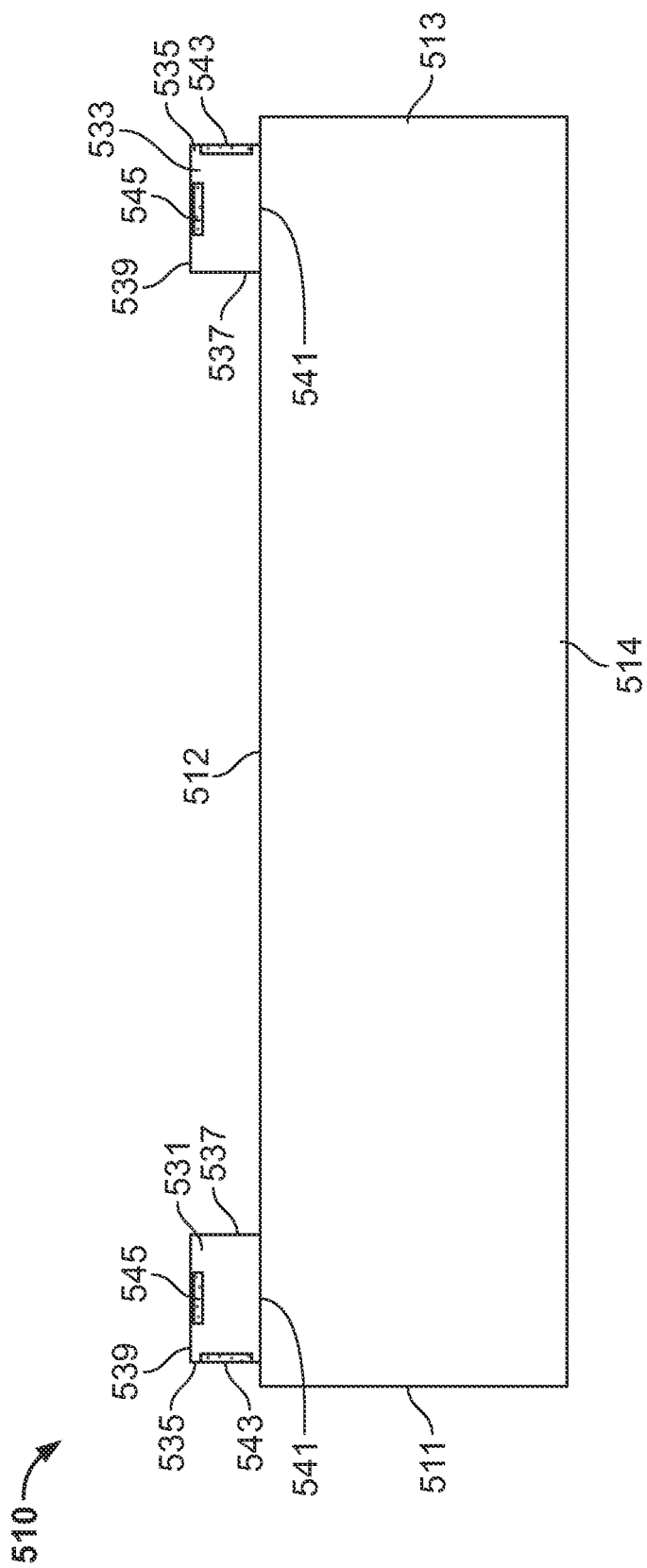

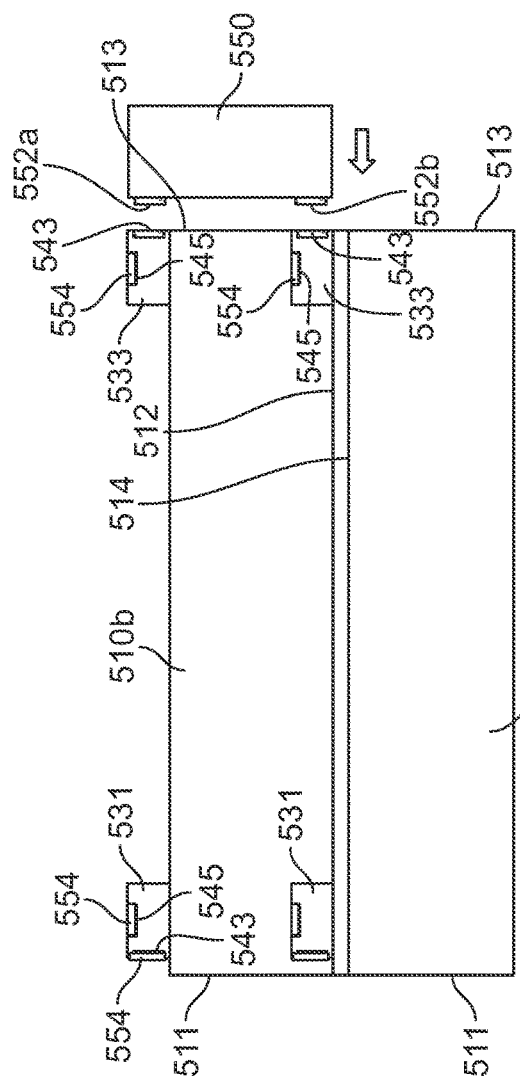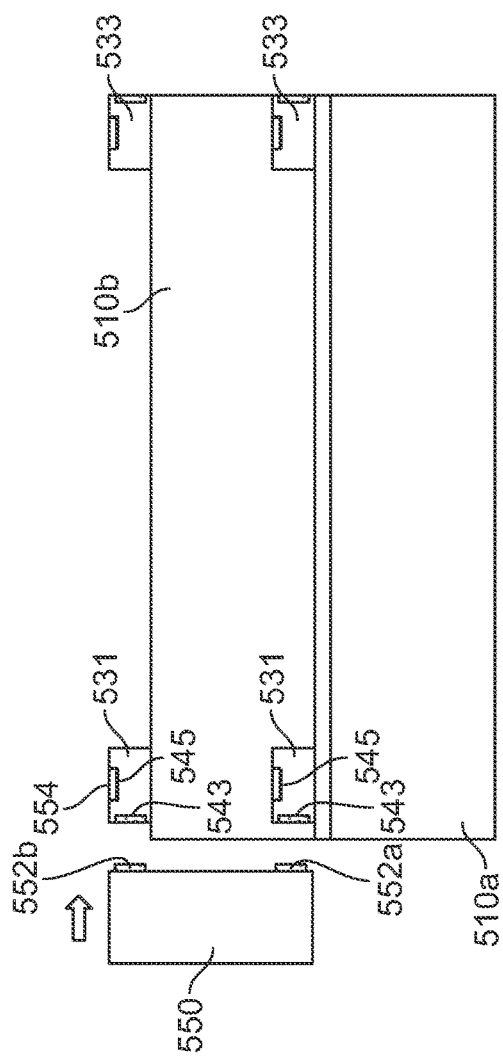

PHOTOVOLTAIC MODULES

CROSS-REFERENCE TO RELATED APPLICATION

This application is a Section 111(a) application relating to and claiming the benefit of commonly-owned, co-pending U.S. Provisional Patent Application Ser. No. 63/055,161, filed Jul. 22, 2020, entitled "PHOTOVOLTAIC SHINGLES AND METHODS OF INSTALLING SAME," U.S. Provisional Patent Application Ser. No. 63/082,725, filed Sep. 24, 2020, entitled "PHOTOVOLTAIC SHINGLES AND METHODS OF INSTALLING SAME," and U.S. Provisional Patent Application Ser. No. 63/191,165, filed May 20, 2021, entitled "PHOTOVOLTAIC SHINGLES AND METHODS OF INSTALLING SAME," the contents of all of which are incorporated herein by reference in their entireties.

FIELD OF THE INVENTION

The present invention relates to photovoltaic modules and, more particularly, photovoltaic modules having electrical connector systems and methods for installing same.

BACKGROUND OF THE INVENTION

Photovoltaic systems having solar panels are commonly installed on roofing of structures. What is needed is a photovoltaic module with electrical connection features for efficient installation thereof.

SUMMARY OF THE INVENTION

In an embodiment, a system includes a photovoltaic module including at least one solar cell having an electrical bussing, an encapsulant encapsulating the at least one solar cell, wherein the encapsulant includes a first surface having at least one first opening, and a frontsheet juxtaposed with the first surface of the encapsulant, wherein the frontsheet includes a first surface, a second surface opposite the first surface of the frontsheet, and at least one second opening extending from the first surface of the frontsheet to the second surface of the frontsheet, wherein the at least one second opening of the frontsheet is in fluid communication with the at least one first opening of the encapsulant, and wherein the electrical bussing is positioned in the at least one first opening; at least one electrical wire having a first end connected to the electrical bussing of the at least one solar cell; and at least one cover attached to the frontsheet and covering the first end of the at least one electrical wire and the at least one first opening and the at least one second opening.

In an embodiment, the encapsulant includes a first layer and a second layer, wherein the at least one first opening is formed within the first layer. In an embodiment, the at least one cover includes a first surface, a second surface opposite the first surface of the at least one cover, at least one channel formed within the second surface of the at least one cover, wherein the at least one channel is sized and shaped to receive the at least one electrical wire, a first edge, a second edge opposite the first edge, and a first aperture formed within the first edge, wherein the at least one channel extends from the first aperture to a location intermediate the first edge and the second edge. In an embodiment, the at least one channel includes a plurality of channels, wherein the at least one cover includes a second aperture, and wherein one of the plurality of channels extends from the second aperture to a location intermediate the first edge and the second edge. In an embodiment, the at least one cover includes a third edge extending from the first edge to the second edge, a fourth edge opposite the third edge and extending from the first edge to the second edge, a third aperture formed within the third edge, and a fourth aperture formed within the fourth edge, wherein one the plurality of channels extends from the third aperture to a location intermediate the third edge and the fourth edge, and wherein one of the plurality of channels extends from the fourth aperture to a location intermediate the third edge and the fourth edge.

In an embodiment, a system including a plurality of photovoltaic modules, each of which includes at least one solar cell, an encapsulant encapsulating the at least one solar cell, a first electrical connector electrically connected to the at least one solar cell and at least partially embedded within the encapsulant, and a second electrical connector electrically connected to the at least one solar cell and freely extending from the encapsulant, wherein one of the plurality of photovoltaic modules is configured to be installed proximate to another of the plurality of photovoltaic modules, and wherein the second electrical connector of the one of the plurality of the photovoltaic modules is configured to be connected to the first electrical connector of the another of the plurality of photovoltaic modules.

In an embodiment, each of the plurality of photovoltaic modules includes a first end and a second end opposite the first end, wherein the first electrical connector is located proximate to the first end, and the second electrical connector is located at the second end. In an embodiment, the encapsulant includes a first layer having a first surface and a second layer having a second surface, and wherein the second electrical connector includes an electrical wire located intermediate the first and second layers of the encapsulant. In an embodiment, each of the plurality of photovoltaic modules includes a flap located intermediate the first and second layers of the encapsulant, wherein the flap includes a free end, wherein the second electrical connector is located on the free end of the flap, wherein the second electrical connector is movable in three-dimensions relative to a corresponding one of the plurality of photovoltaic modules, and wherein the first electrical connector is fixed within the encapsulant. In an embodiment, each of the plurality of photovoltaic modules includes a frontsheet juxtaposed with a first surface of the encapsulant, wherein the at least one solar cell includes an electrical bussing, wherein the first surface of the encapsulant includes at least one first opening, and wherein the frontsheet includes a first surface, a second surface opposite the first surface of the frontsheet, and at least one second opening extending from the first surface of the frontsheet to the second surface of the frontsheet, wherein the at least one second opening of the frontsheet is in fluid communication with the at least one first opening of the encapsulant, and wherein the electrical bussing is positioned in the at least one first opening, and wherein the at least one first electrical connector includes a wire with a first end electrically connected to the electrical bussing, and wherein each of the photovoltaic modules includes at least one cover attached to the frontsheet and covering the first end of the wire and the at least one first opening and the at least one second opening.

In an embodiment, a system includes a plurality of photovoltaic modules, each of which includes at least one solar cell, a first electrical connector electrically connected to the at least one solar cell, and a second electrical connector electrically connected to the at least one solar cell, wherein a first photovoltaic module of the plurality of photovoltaic modules is configured to be installed proximate to a second photovoltaic module of the plurality of photovoltaic modules; and at least one electrical jumper configured to connect to the first electrical connector of the first photovoltaic module and the second electrical connector of the second photovoltaic module.

In an embodiment, each of the first and second electrical connectors includes a first end, a second end opposite the first end of the corresponding one of the first and second electrical connectors, a first side extending from the first end of the corresponding first and second electrical connectors to the second end of the corresponding first and second electrical connectors, a first port and a second port, wherein each of the first ports is located at the first end of the corresponding first and second electrical connectors, wherein each of the second ports is located at the first side of the corresponding first and second electrical connectors, and wherein the at least one electrical jumper includes at least a pair of terminals. In an embodiment, the second electrical connector of the first photovoltaic module and the first electrical connector of the second photovoltaic module are configured to receive the at least one electrical jumper, such that one of the pair of terminals is connected to the second port of the second electrical connector of the first photovoltaic module, and the other of the pair of terminals is connected to the second port of the first electrical connector of the second photovoltaic module. In an embodiment, the second electrical connector of the first photovoltaic module and the second electrical connector of the second photovoltaic module receive the at least one electrical jumper, such that the one of the pair of terminals is connected to the first port of the second electrical connector of the first photovoltaic module, and the other of the pair of terminals is connected to the first port of the second electrical connector of the second photovoltaic module. In an embodiment, the first electrical connector of the first photovoltaic module and the first electrical connector of the second photovoltaic module receive the at least one electrical jumper, such that one of the pair of terminals is connected to the first port of the first electrical connector of the first photovoltaic module, and the other of the pair of terminals is connected to the first port of the first electrical connector of the second photovoltaic module. In an embodiment, the plurality of photovoltaic modules includes a third photovoltaic module, wherein the second electrical connector of the second photovoltaic module and the second electrical connector of the third photovoltaic module receive a second one of the at least one electrical jumper, such that one of the pair of terminals of the second electrical jumper is connected to the first port of the second electrical connector of the second photovoltaic module, and the other of the pair of terminals of the second one of the at least one electrical jumper is connected to the first port of the second electrical connector of the third photovoltaic module.

In an embodiment, a system includes a plurality of photovoltaic modules, each of which includes a first end, a second end opposite the first end, and at least one solar cell, wherein a first photovoltaic module of the plurality of photovoltaic modules is configured to be installed proximate to a second photovoltaic module of the plurality of photovoltaic modules; a plurality of electrical connectors, each of which is electrically connected to the at least one solar cell of a corresponding one of the plurality of photovoltaic modules, wherein one of the plurality of electrical connectors connected to the first photovoltaic module is electrically connected to another of the plurality of electrical connectors connected to the second photovoltaic module; and a wire channel located proximate to the first end of each of the plurality of photovoltaic modules, wherein at least a portion of each of the plurality of electrical connectors is located within the wire channel, and wherein the wire channel includes a height of 1 mm to 15 mm.

In an embodiment, each of the plurality of photovoltaic modules includes a headlap having a first end and a second end opposite the first end of the headlap, wherein the first end of the headlap is offset from the first end of the photovoltaic module, and wherein at least a second portion of each of the plurality of electrical connectors is located within the corresponding one of the headlap. In an embodiment, the headlap includes a first layer and a second layer, wherein the at least a second portion of each of the plurality of electrical connectors is located intermediate the first layer and the second layer. In an embodiment, a gap area is formed intermediate the first end of the headlap of the first photovoltaic module and the first end of the second photovoltaic module, and wherein at least a portion of the electrical connector of the first photovoltaic module is located within the gap area.

BRIEF DESCRIPTION OF THE DRAWINGS

FIG. 1 is a schematic top plan view of an embodiment of a photovoltaic module;

FIG. 2 is a schematic, side cross-sectional view of the photovoltaic module of FIG. 1;

FIGS. 3A and 3B are a top perspective views of an embodiment of a cover employed by the photovoltaic module of FIG. 1;

FIGS. 7A through 7D are embodiments of a cover employed by the photovoltaic module of FIG. 1;

FIG. 9 is a top plan view of an embodiment of a photovoltaic module including a plurality of electrical connectors;

FIGS. 12A through 12C are top and bottom plan views and a schematic side cross-sectional view, respectively, of an embodiment of a photovoltaic module including a plurality of electrical connectors;

FIGS. 16A through 16C are schematic views of embodiments of photovoltaic modules utilizing various configurations of the cover shown in FIGS. 3A through 5 and FIG. 7B and the electrical connectors of FIGS. 9 through 15;

FIG. 17 is a schematic view of an embodiment of a photovoltaic module;

FIGS. 19A and 19B are schematic views of embodiments of photovoltaic systems;

DETAILED DESCRIPTION

Figure 5:
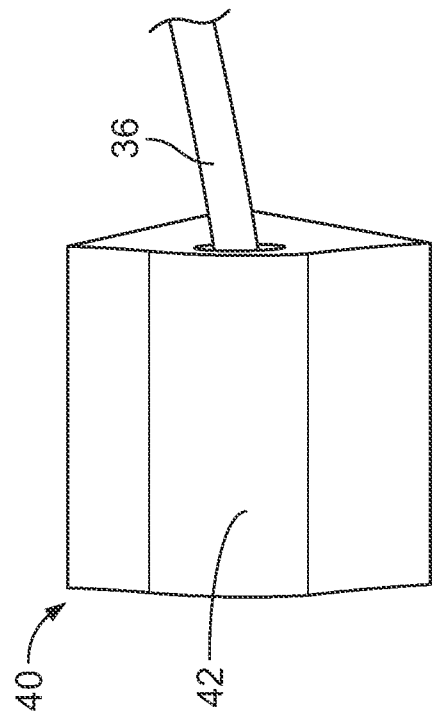
FIG. 5 is a top perspective view of the cover of FIGS. 3A and 3B with an electrical wire received by the cover.

Referring to FIGS. 1 and 2, in an embodiment, a photovoltaic module 10 includes at least one solar cell 12, an encapsulant 14 encapsulating the at least one solar cell 12, and a frontsheet 16 juxtaposed with the encapsulant 14. As used herein, the terms "encapsulating" and "encapsulates" mean to partially or fully envelope or enclose, and with respect to certain embodiments of the photovoltaic module 10, the at least one solar cell 12 is fully enveloped by or enclosed within the encapsulant 14, or partially enveloped by or enclosed within the encapsulant 14.

In an embodiment, the encapsulant 14 encapsulates 50% to 99.9% of an exterior surface area of the at least one solar cell 12. In another embodiment, the encapsulant 14 encapsulates 55% to 99.9% of an exterior surface area of the at least one solar cell 12. In another embodiment, the encapsulant 14 encapsulates 60% to 99.9% of an exterior surface area of the at least one solar cell 12. In another embodiment, the encapsulant 14 encapsulates 65% to 99.9% of an exterior surface area of the at least one solar cell 12. In another embodiment, the encapsulant 14 encapsulates 70% to 99.9% of an exterior surface area of the at least one solar cell 12. In another embodiment, the encapsulant 14 encapsulates 75% to 99.9% of an exterior surface area of the at least one solar cell 12. In another embodiment, the encapsulant 14 encapsulates 80% to 99.9% of an exterior surface area of the at least one solar cell 12. In another embodiment, the encapsulant 14 encapsulates 85% to 99.9% of an exterior surface area of the at least one solar cell 12. In another embodiment, the encapsulant 14 encapsulates 90% to 99.9% of an exterior surface area of the at least one solar cell 12. In another embodiment, the encapsulant 14 encapsulates 95% to 99.9% of an exterior surface area of the at least one solar cell 12.

In another embodiment, the encapsulant 14 encapsulates 50% to 95% of an exterior surface area of the at least one solar cell 12. In another embodiment, the encapsulant 14 encapsulates 55% to 95% of an exterior surface area of the at least one solar cell 12. In another embodiment, the encapsulant 14 encapsulates 60% to 95% of an exterior surface area of the at least one solar cell 12. In another embodiment, the encapsulant 14 encapsulates 65% to 95% of an exterior surface area of the at least one solar cell 12. In another embodiment, the encapsulant 14 encapsulates 70% to 95% of an exterior surface area of the at least one solar cell 12. In another embodiment, the encapsulant 14 encapsulates 75% to 95% of an exterior surface area of the at least one solar cell 12. In another embodiment, the encapsulant 14 encapsulates 80% to 95% of an exterior surface area of the at least one solar cell 12. In another embodiment, the encapsulant 14 encapsulates 85% to 95% of an exterior surface area of the at least one solar cell 12. In another embodiment, the encapsulant 14 encapsulates 90% to 95% of an exterior surface area of the at least one solar cell 12.

In another embodiment, the encapsulant 14 encapsulates 50% to 90% of an exterior surface area of the at least one solar cell 12. In another embodiment, the encapsulant 14 encapsulates 55% to 90% of an exterior surface area of the at least one solar cell 12. In another embodiment, the encapsulant 14 encapsulates 60% to 90% of an exterior surface area of the at least one solar cell 12. In another embodiment, the encapsulant 14 encapsulates 65% to 90% of an exterior surface area of the at least one solar cell 12. In another embodiment, the encapsulant 14 encapsulates 70% to 90% of an exterior surface area of the at least one solar cell 12. In another embodiment, the encapsulant 14 encapsulates 75% to 90% of an exterior surface area of the at least one solar cell 12. In another embodiment, the encapsulant 14 encapsulates 80% to 90% of an exterior surface area of the at least one solar cell 12. In another embodiment, the encapsulant 14 encapsulates 85% to 90% of an exterior surface area of the at least one solar cell 12.

In another embodiment, the encapsulant 14 encapsulates 50% to 85% of an exterior surface area of the at least one solar cell 12. In another embodiment, the encapsulant 14 encapsulates 55% to 85% of an exterior surface area of the at least one solar cell 12. In another embodiment, the encapsulant 14 encapsulates 60% to 85% of an exterior surface area of the at least one solar cell 12. In another embodiment, the encapsulant 14 encapsulates 65% to 85% of an exterior surface area of the at least one solar cell 12. In another embodiment, the encapsulant 14 encapsulates 70% to 85% of an exterior surface area of the at least one solar cell 12. In another embodiment, the encapsulant 14 encapsulates 75% to 85% of an exterior surface area of the at least one solar cell 12. In another embodiment, the encapsulant 14 encapsulates 80% to 85% of an exterior surface area of the at least one solar cell 12.

In another embodiment, the encapsulant 14 encapsulates 50% to 80% of an exterior surface area of the at least one solar cell 12. In another embodiment, the encapsulant 14 encapsulates 55% to 80% of an exterior surface area of the at least one solar cell 12. In another embodiment, the encapsulant 14 encapsulates 60% to 80% of an exterior surface area of the at least one solar cell 12. In another embodiment, the encapsulant 14 encapsulates 65% to 80% of an exterior surface area of the at least one solar cell 12. In another embodiment, the encapsulant 14 encapsulates 70% to 80% of an exterior surface area of the at least one solar cell 12. In another embodiment, the encapsulant 14 encapsulates 75% to 80% of an exterior surface area of the at least one solar cell 12.

In another embodiment, the encapsulant 14 encapsulates 50% to 75% of an exterior surface area of the at least one solar cell 12. In another embodiment, the encapsulant 14 encapsulates 55% to 75% of an exterior surface area of the at least one solar cell 12. In another embodiment, the encapsulant 14 encapsulates 60% to 75% of an exterior surface area of the at least one solar cell 12. In another embodiment, the encapsulant 14 encapsulates 65% to 75% of an exterior surface area of the at least one solar cell 12. In another embodiment, the encapsulant 14 encapsulates 70% to 75% of an exterior surface area of the at least one solar cell 12.

In another embodiment, the encapsulant 14 encapsulates 50% to 70% of an exterior surface area of the at least one solar cell 12. In another embodiment, the encapsulant 14 encapsulates 55% to 70% of an exterior surface area of the at least one solar cell 12. In another embodiment, the encapsulant 14 encapsulates 60% to 70% of an exterior surface area of the at least one solar cell 12. In another embodiment, the encapsulant 14 encapsulates 65% to 70% of an exterior surface area of the at least one solar cell 12.

In another embodiment, the encapsulant 14 encapsulates 50% to 65% of an exterior surface area of the at least one solar cell 12. In another embodiment, the encapsulant 14 encapsulates 55% to 65% of an exterior surface area of the at least one solar cell 12. In another embodiment, the encapsulant 14 encapsulates 60% to 65% of an exterior surface area of the at least one solar cell 12. In another embodiment, the encapsulant 14 encapsulates 50% to 60% of an exterior surface area of the at least one solar cell 12. In another embodiment, the encapsulant 14 encapsulates 55% to 60% of an exterior surface area of the at least one solar cell 12. In another embodiment, the encapsulant 14 encapsulates 55% to 60% of an exterior surface area of the at least one solar cell 12.

In an embodiment, the encapsulant 14 encapsulates 50% of an exterior surface area of the at least one solar cell 12. In another embodiment, the encapsulant 14 encapsulates 55% of the exterior surface area of the at least one solar cell 12. In another embodiment, the encapsulant 14 encapsulates 60% of the exterior surface area of the at least one solar cell 12. In another embodiment, the encapsulant 14 encapsulates 65% of the exterior surface area of the at least one solar cell 12. In another embodiment, the encapsulant 14 encapsulates 70% of the exterior surface area of the at least one solar cell 12. In another embodiment, the encapsulant 14 encapsulates 75% of the exterior surface area of the at least one solar cell 12. In another embodiment, the encapsulant 14 encapsulates 80% of the exterior surface area of the at least one solar cell 12. In another embodiment, the encapsulant 14 encapsulates 85% of the exterior surface area of the at least one solar cell 12. In another embodiment, the encapsulant 14 encapsulates 90% of the exterior surface area of the at least one solar cell 12. In another embodiment, the encapsulant 14 encapsulates 95% of the exterior surface area of the at least one solar cell 12. In another embodiment, the encapsulant 14 encapsulates 100% of the exterior surface area of the at least one solar cell 12.

In an embodiment, the photovoltaic module 10 is configured to be attached to a roof deck 100. In an embodiment, the at least one solar cell 12 includes a plurality of solar cells 12. In an embodiment, the encapsulant 14 includes a first surface 18 and a second surface 20 opposite the first surface. In an embodiment, the frontsheet 16 is juxtaposed with the first surface 18 of the encapsulant 14. In an embodiment, the encapsulant 14 may be made from polyolefins, ethyl vinyl acetates, ionomers, silicones, poly vinyl butyral, epoxies, polyurethanes, or combinations/hybrids thereof.

Still referring to FIGS. 1 and 2, in an embodiment, the at least one solar cell 12 includes an electrical bussing 22. In an embodiment, the encapsulant 14 includes at least one first opening 24 formed within the first surface 18 thereof. In an embodiment, the encapsulant 14 includes a first layer 26 and a second layer 28, wherein the at least one first opening 24 is formed within the first layer 26. In an embodiment, the frontsheet 16 includes a first surface 30, a second surface 32 opposite the first surface 30 of the frontsheet 16, and at least one second opening 34 extending from the first surface 30 of the frontsheet 16 to the second surface 32 of the frontsheet 16. In an embodiment, the at least one second opening 34 of the frontsheet 16 is in fluid communication with the at least one first opening 24 of the encapsulant 14. In an embodiment, the electrical bussing 22 is positioned in the at least one first opening 24 of the encapsulant 14. In an embodiment, the electrical bussing 22 further extends into the at least one second opening 34 of the frontsheet 16.

In an embodiment, the frontsheet 16 is made from a polymer. In an embodiment, the frontsheet 16 includes thermoplastic polyolefin (TPO). In other embodiments, the frontsheet 16 is made of polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), or polyimide.

In an embodiment, the photovoltaic module 10 includes at least one electrical wire 36 having a first end 38 connected to the electrical bussing 22 of the at least one solar cell 12. In an embodiment, the at least one electrical wire 36 is soldered to the electrical bussing 22. In another embodiment, the at least one electrical wire 36 is crimped to the electrical bussing 22. In another embodiment, at least one electrical wire 36 is connected to the electrical bussing 22 by a spring clamp.

In an embodiment, the at least one electrical wire 36 includes an outer diameter in range of 4 mm to 7 mm. In another embodiment, the at least one electrical wire 36 includes an outer diameter in range of 5 mm to 7 mm. In another embodiment, the at least one electrical wire 36 includes an outer diameter in range of 6 mm to 7 mm. In another embodiment, the at least one electrical wire 36 includes an outer diameter in range of 5 mm to 7 mm. In another embodiment, the at least one electrical wire 36 includes an outer diameter in range of 4 mm to 6 mm. In another embodiment, the at least one electrical wire 36 includes an outer diameter in range of 5 mm to 6 mm. In another embodiment, the at least one electrical wire 36 includes an outer diameter in range of 4 mm to 5 mm.

Referring to FIGS. 3A through 6, in an embodiment, the photovoltaic module 10 includes at least one cover 40. In an embodiment, the cover 40 is attached to the frontsheet 16 and covers the first end 38 of the at least one electrical wire 36 and the at least one first opening 24 of the encapsulant 14 and the at least one second opening 34 of the frontsheet 16. In an embodiment, the cover 40 includes a first surface 42, a second surface 44 opposite the first surface 42, and at least one channel 46 formed within the second surface 44. In an embodiment, the at least one channel 46 is sized and shaped to receive the at least one electrical wire 36. In an embodiment, the at least one cover 40 includes a first edge 48, a second edge 50 opposite the first edge 48, a third edge 52 extending from the first edge 48 to the second edge 50, and a fourth edge 54 opposite the third edge 52 and extending from the first edge 48 to the second edge 50. In an embodiment, the cover 40 includes a first aperture 56 formed within the first edge 48. In an embodiment, the at least one channel 46 extends from the first aperture 56 to a location 58 intermediate the first edge 48 and the second edge 50.

Still referring to FIGS. 3A through 6, in an embodiment, the at least one channel 46 includes a first portion 60 and a second portion 62 adjacent the first portion 60. In an embodiment, the first portion 60 is configured to receive the at least one electrical wire 36, and the second portion 62 is configured to receive a connection point 63 formed by the connected first end 38 of the at least one electrical wire 36 and the electrical bussing 22 of the at least one solar cell 12. In an embodiment, the first portion 60 of the at least one channel 46 includes a semi-cylindrical shape. In an embodiment, the second portion 62 of the at least one channel 46 includes a box shape. In an embodiment, the first surface 42 of the at least one cover 40 includes a curvilinear shape. In an embodiment, the second surface 44 of the at least one cover 40 is substantially flat. In an embodiment, the at least one channel 46 includes a sealant.

Referring to FIGS. 7A through 7D, in an embodiment, the at least one channel 46 includes a plurality of channels 46. In an embodiment, the cover 40 includes a second aperture 64, wherein one of the plurality of channels 46 extends from the second aperture 64 to a location intermediate the first edge 48 and the second edge 50. In an embodiment, the second aperture 64 is formed within the first edge 48. In an embodiment, the first aperture 56 and the second aperture 64 are proximate to one another. In an embodiment, the second aperture 64 is located at the second edge 50. In an embodiment, the first aperture 56 and the second aperture 64 are opposed to one another.

In an embodiment, the cover 40 includes a third aperture 66 formed within the third edge 52. In an embodiment, one the plurality of channels 46 extends from the third aperture 66 to a location intermediate the third edge 52 and the fourth edge 54. In an embodiment, the cover 40 includes a fourth aperture 68 formed within the fourth edge 54. In an embodiment, one of the plurality of channels 46 extends from the fourth aperture 68 to a location intermediate the third edge 52 and the fourth edge 54.

In an embodiment, the cover 40 includes a thickness in a range of 1 mm to 15 mm. In another embodiment, the cover 40 includes a thickness in a range of 2 mm to 15 mm. In another embodiment, the cover 40 includes a thickness in a range of 3 mm to 15 mm. In another embodiment, the cover 40 includes a thickness in a range of 4 mm to 15 mm. In another embodiment, the cover 40 includes a thickness in a range of 5 mm to 15 mm. In another embodiment, the cover 40 includes a thickness in a range of 6 mm to 15 mm. In another embodiment, the cover 40 includes a thickness in a range of 7 mm to 15 mm. In another embodiment, the cover 40 includes a thickness in a range of 8 mm to 15 mm. In another embodiment, the cover 40 includes a thickness in a range of 9 mm to 15 mm. In another embodiment, the cover 40 includes a thickness in a range of 10 mm to 15 mm. In another embodiment, the cover 40 includes a thickness in a range of 11 mm to 15 mm. In another embodiment, the cover 40 includes a thickness in a range of 12 mm to 15 mm. In another embodiment, the cover 40 includes a thickness in a range of 13 mm to 15 mm. In another embodiment, the cover 40 includes a thickness in a range of 14 mm to 15 mm.

In another embodiment, the cover 40 includes a thickness in a range of 1 mm to 14 mm. In another embodiment, the cover 40 includes a thickness in a range of 2 mm to 14 mm. In another embodiment, the cover 40 includes a thickness in a range of 3 mm to 14 mm. In another embodiment, the cover 40 includes a thickness in a range of 4 mm to 14 mm. In another embodiment, the cover 40 includes a thickness in a range of 5 mm to 14 mm. In another embodiment, the cover 40 includes a thickness in a range of 6 mm to 14 mm. In another embodiment, the cover 40 includes a thickness in a range of 7 mm to 14 mm. In another embodiment, the cover 40 includes a thickness in a range of 8 mm to 14 mm. In another embodiment, the cover 40 includes a thickness in a range of 9 mm to 14 mm. In another embodiment, the cover 40 includes a thickness in a range of 10 mm to 14 mm. In another embodiment, the cover 40 includes a thickness in a range of 11 mm to 14 mm. In another embodiment, the cover 40 includes a thickness in a range of 12 mm to 14 mm. In another embodiment, the cover 40 includes a thickness in a range of 13 mm to 14 mm.

In another embodiment, the cover 40 includes a thickness in a range of 1 mm to 13 mm. In another embodiment, the cover 40 includes a thickness in a range of 2 mm to 13 mm. In another embodiment, the cover 40 includes a thickness in a range of 3 mm to 13 mm. In another embodiment, the cover 40 includes a thickness in a range of 4 mm to 13 mm. In another embodiment, the cover 40 includes a thickness in a range of 5 mm to 13 mm. In another embodiment, the cover 40 includes a thickness in a range of 6 mm to 13 mm. In another embodiment, the cover 40 includes a thickness in a range of 7 mm to 13 mm. In another embodiment, the cover 40 includes a thickness in a range of 8 mm to 13 mm. In another embodiment, the cover 40 includes a thickness in a range of 9 mm to 13 mm. In another embodiment, the cover 40 includes a thickness in a range of 10 mm to 13 mm. In another embodiment, the cover 40 includes a thickness in a range of 11 mm to 13 mm. In another embodiment, the cover 40 includes a thickness in a range of 12 mm to 13 mm.

In another embodiment, the cover 40 includes a thickness in a range of 1 mm to 12 mm. In another embodiment, the cover 40 includes a thickness in a range of 2 mm to 12 mm. In another embodiment, the cover 40 includes a thickness in a range of 3 mm to 12 mm. In another embodiment, the cover 40 includes a thickness in a range of 4 mm to 12 mm. In another embodiment, the cover 40 includes a thickness in a range of 5 mm to 12 mm. In another embodiment, the cover 40 includes a thickness in a range of 6 mm to 12 mm. In another embodiment, the cover 40 includes a thickness in a range of 7 mm to 12 mm. In another embodiment, the cover 40 includes a thickness in a range of 8 mm to 12 mm. In another embodiment, the cover 40 includes a thickness in a range of 9 mm to 12 mm. In another embodiment, the cover 40 includes a thickness in a range of 10 mm to 12 mm. In another embodiment, the cover 40 includes a thickness in a range of 11 mm to 12 mm.

In another embodiment, the cover 40 includes a thickness in a range of 1 mm to 11 mm. In another embodiment, the cover 40 includes a thickness in a range of 2 mm to 11 mm. In another embodiment, the cover 40 includes a thickness in a range of 3 mm to 11 mm. In another embodiment, the cover 40 includes a thickness in a range of 4 mm to 11 mm. In another embodiment, the cover 40 includes a thickness in a range of 5 mm to 11 mm. In another embodiment, the cover 40 includes a thickness in a range of 6 mm to 11 mm. In another embodiment, the cover 40 includes a thickness in a range of 7 mm to 11 mm. In another embodiment, the cover 40 includes a thickness in a range of 8 mm to 11 mm. In another embodiment, the cover 40 includes a thickness in a range of 9 mm to 11 mm. In another embodiment, the cover 40 includes a thickness in a range of 10 mm to 11 mm.

In another embodiment, the cover 40 includes a thickness in a range of 1 mm to 10 mm. In another embodiment, the cover 40 includes a thickness in a range of 2 mm to 10 mm. In another embodiment, the cover 40 includes a thickness in a range of 3 mm to 10 mm. In another embodiment, the cover 40 includes a thickness in a range of 4 mm to 10 mm. In another embodiment, the cover 40 includes a thickness in a range of 5 mm to 10 mm. In another embodiment, the cover 40 includes a thickness in a range of 6 mm to 10 mm. In another embodiment, the cover 40 includes a thickness in a range of 7 mm to 10 mm. In another embodiment, the cover 40 includes a thickness in a range of 8 mm to 10 mm. In another embodiment, the cover 40 includes a thickness in a range of 9 mm to 10 mm.

In another embodiment, the cover 40 includes a thickness in a range of 1 mm to 9 mm. In another embodiment, the cover 40 includes a thickness in a range of 2 mm to 9 mm. In another embodiment, the cover 40 includes a thickness in a range of 3 mm to 9 mm. In another embodiment, the cover 40 includes a thickness in a range of 4 mm to 9 mm. In another embodiment, the cover 40 includes a thickness in a range of 5 mm to 9 mm. In another embodiment, the cover 40 includes a thickness in a range of 6 mm to 9 mm. In another embodiment, the cover 40 includes a thickness in a range of 7 mm to 9 mm. In another embodiment, the cover 40 includes a thickness in a range of 8 mm to 9 mm.

In another embodiment, the cover 40 includes a thickness in a range of 1 mm to 8 mm. In another embodiment, the cover 40 includes a thickness in a range of 2 mm to 8 mm. In another embodiment, the cover 40 includes a thickness in a range of 3 mm to 8 mm. In another embodiment, the cover 40 includes a thickness in a range of 4 mm to 8 mm. In another embodiment, the cover 40 includes a thickness in a range of 5 mm to 8 mm. In another embodiment, the cover 40 includes a thickness in a range of 6 mm to 8 mm. In another embodiment, the cover 40 includes a thickness in a range of 7 mm to 8 mm.

In another embodiment, the cover 40 includes a thickness in a range of 1 mm to 7 mm. In another embodiment, the cover 40 includes a thickness in a range of 2 mm to 7 mm. In another embodiment, the cover 40 includes a thickness in a range of 3 mm to 7 mm. In another embodiment, the cover 40 includes a thickness in a range of 4 mm to 7 mm. In another embodiment, the cover 40 includes a thickness in a range of 5 mm to 7 mm. In another embodiment, the cover 40 includes a thickness in a range of 6 mm to 7 mm.

In another embodiment, the cover 40 includes a thickness in a range of 1 mm to 6 mm. In another embodiment, the cover 40 includes a thickness in a range of 2 mm to 6 mm. In another embodiment, the cover 40 includes a thickness in a range of 3 mm to 6 mm. In another embodiment, the cover 40 includes a thickness in a range of 4 mm to 6 mm. In another embodiment, the cover 40 includes a thickness in a range of 5 mm to 6 mm.

In another embodiment, the cover 40 includes a thickness in a range of 1 mm to 5 mm. In another embodiment, the cover 40 includes a thickness in a range of 2 mm to 5 mm. In another embodiment, the cover 40 includes a thickness in a range of 3 mm to 5 mm. In another embodiment, the cover 40 includes a thickness in a range of 4 mm to 5 mm. In another embodiment, the cover 40 includes a thickness in a range of 1 mm to 4 mm. In another embodiment, the cover 40 includes a thickness in a range of 2 mm to 4 mm. In another embodiment, the cover 40 includes a thickness in a range of 3 mm to 4 mm. In another embodiment, the cover 40 includes a thickness in a range of 1 mm to 3 mm. In another embodiment, the cover 40 includes a thickness in a range of 2 mm to 3 mm. In another embodiment, the cover 40 includes a thickness in a range of 1 mm to 2 mm.

In an embodiment, the cover 40 is made from a polymer. In an embodiment, the cover 40 includes thermoplastic polyolefin (TPO). In other embodiments, the cover 40 is made of polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), or polyimide.

In an embodiment, the cover 40 is ultrasonically welded to the frontsheet 16. In another embodiment, the cover 40 is heat welded to the frontsheet 16. In another embodiment, the cover 40 is thermally bonded to the frontsheet 16.

Figure 8:
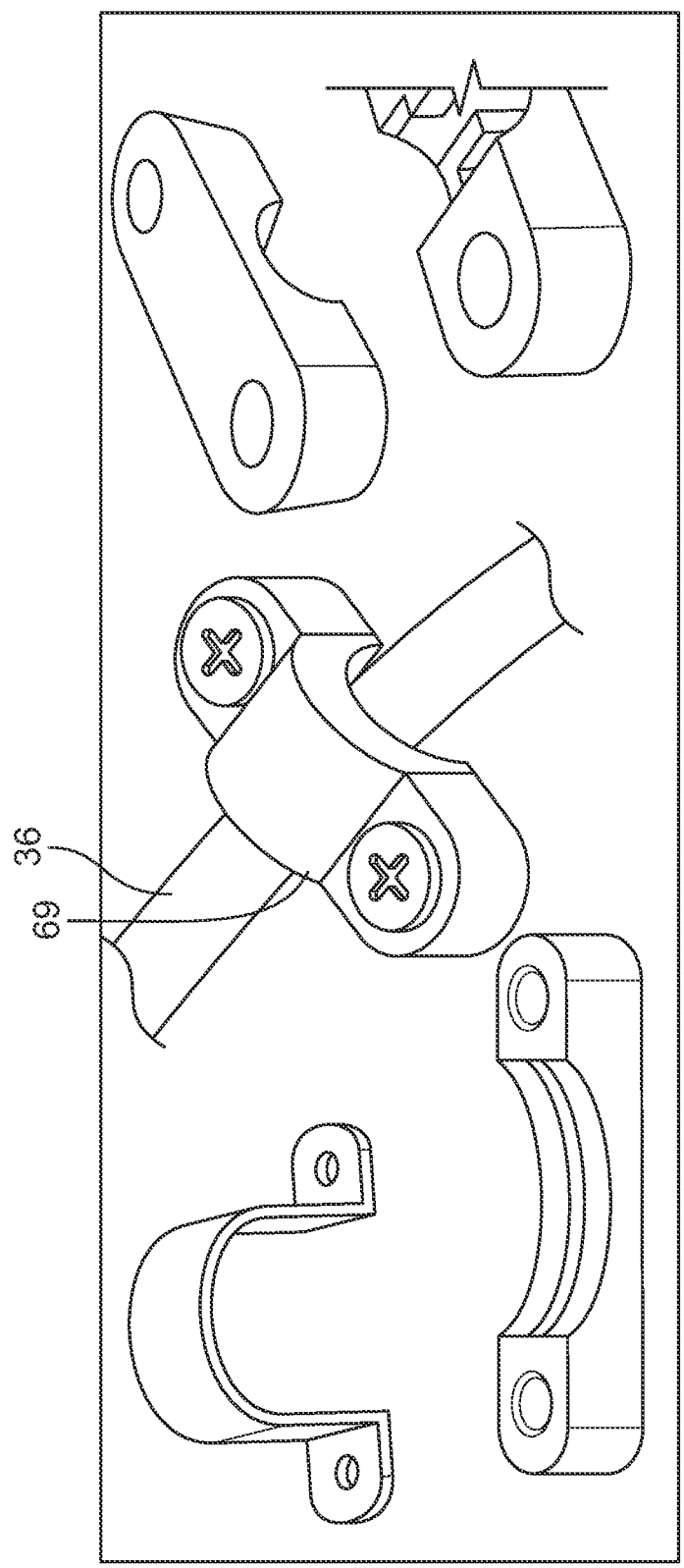
FIG. 8 illustrate a plurality of strain reliefs employed by the photovoltaic module of FIG. 1.

Referring to FIGS. 1 and 8, in an embodiment, the photovoltaic module 10 includes at least one strain relief 69 configured to receive the at least one electrical wire 36. In an embodiment, the at least one strain relief 69 is attached to the first surface of the frontsheet 16. In an embodiment, the at least one strain relief 69 includes a plurality of strain reliefs 69. In an embodiment, each of the plurality of strain reliefs 69 is configured to receive a corresponding one of the at least one electrical wire 36. In certain embodiments, the at least one strain relief 69 can include various shapes and sizes to accommodate the shape and size of the at least one electrical wire 36.

In another embodiment, the at least one solar cell 12 includes a plurality of solar cells 12, the at least one first opening 24 of the encapsulant 14 includes a plurality of first openings 24, and the at least one second opening 34 of the frontsheet 16 includes a plurality of second openings 34, each of which is in fluid communication with a corresponding one of the plurality of first openings 24. In an embodiment, the at least one electrical wire 36 includes a plurality of electrical wires 36, each of which is connected to a corresponding one of the electrical bussing 22 of the plurality of solar cells 12. In an embodiment, the at least one cover 40 includes a plurality of covers 40, each of which covers a corresponding one of the first end 38 of the plurality of electrical wires 36 and the corresponding plurality of first openings 24 and plurality of second openings 34.

Figure 4:
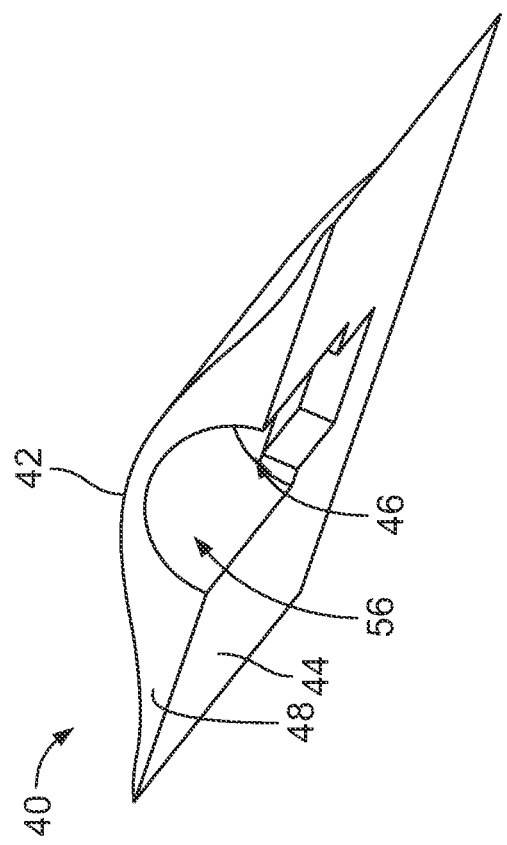
FIG. 4 is a bottom perspective view of the cover of FIGS. 3A and 3B.
Figure 6:
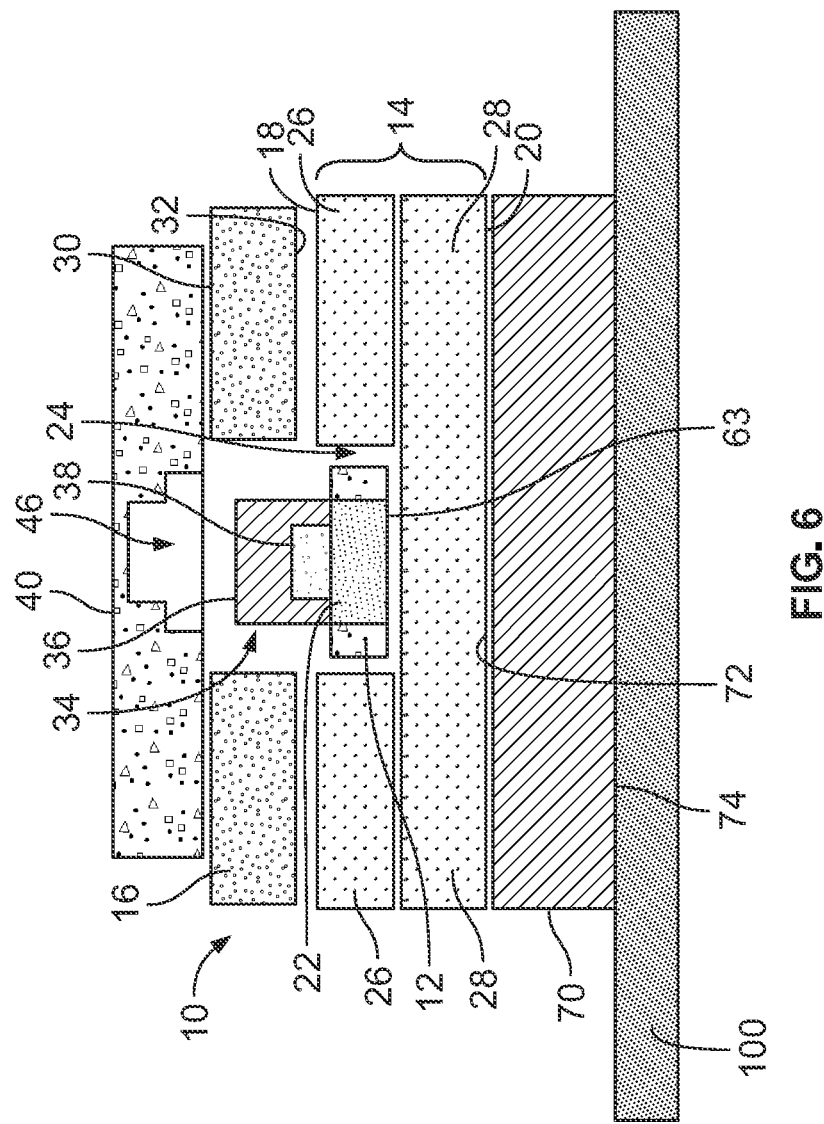
FIG. 6 is a schematic, side cross-sectional view of the photovoltaic module of FIG. 1 with the cover of FIGS. 3A and 3B.

Referring to FIGS. 1 and 4, in an embodiment, the photovoltaic module 10 includes a backsheet 70 juxtaposed with the second surface 20 of the encapsulant 14. In an embodiment, the backsheet 70 includes a first surface 72 and a second surface 74 opposite the first surface 72, the first surface 72 being juxtaposed with the second surface 20 of the encapsulant 14, and the second surface 74 being juxtaposed with the roof deck 100. In an embodiment, the backsheet 70 includes a polymer. In an embodiment, the polymer includes a fluoropolymer. In the fluoropolymer is selected from the group consisting of ethylene tetrafluoroethylene (ETFE), polyvinylidene fluoride (PVDF), tetrafluoroethylene-hexafluoropropylene copolymers (FEP), tetrafluoroethylene-hexafluoropropylene-vinylidene fluoride copolymers (THV), and blends thereof. In another embodiment, the backsheet 70 includes thermoplastic polyolefin (TPO). In an embodiment, the backsheet 70 includes a single layer, moisture-resistant, fire-retardant membrane. In an embodiment, the backsheet 70 includes thermoplastic polyolefin (TPO). In another embodiment, the backsheet 70 includes a metal hydroxide. In an embodiment, the metal hydroxide includes an aluminum hydroxide. In another embodiment, the backsheet 70 includes polyvinyl chloride. In another embodiment, the backsheet 70 includes a first ply and a second ply. In other embodiments, the backsheet 70 includes a plurality of layers. In other embodiments, the photovoltaic module 10 may include more than one backsheet 70.

Figure 11:
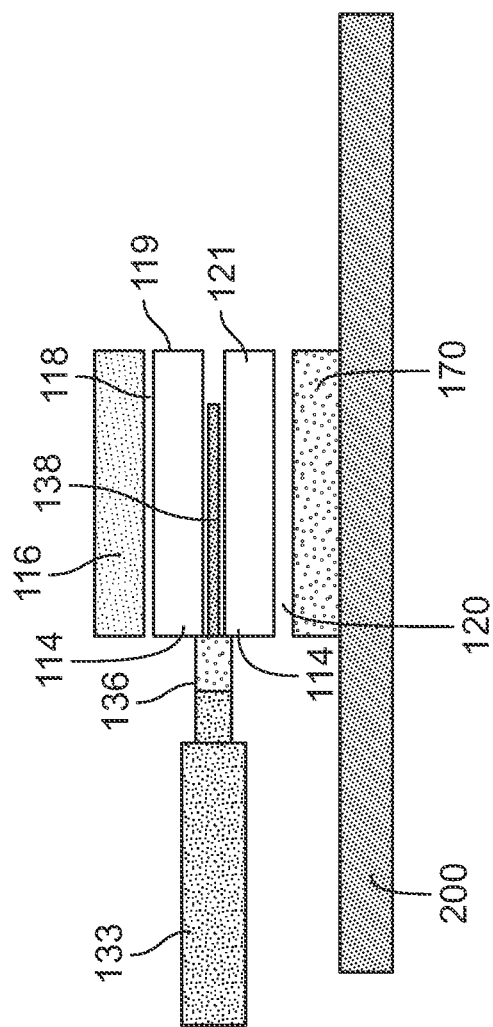
FIG. 11 is a schematic side cross-sectional view of an embodiment of the photovoltaic module of FIG. 9.
Figure 10:
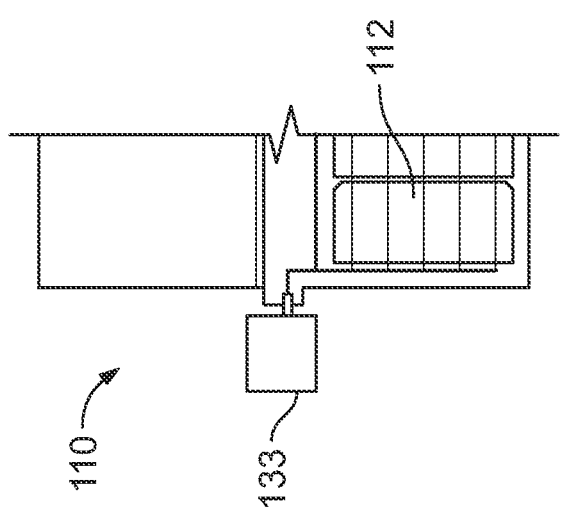
FIG. 10 is a schematic top plan view of a section of the photovoltaic module of FIG. 9.

Referring to FIGS. 9 through 11, in an embodiment, a photovoltaic module 110 includes at least one solar cell 112 and an encapsulant 114 encapsulating the at least one solar cell 112. In an embodiment, the photovoltaic module 110 includes a frontsheet 116 juxtaposed with a first surface 118 of the encapsulant 114. In an embodiment, the frontsheet 116 includes a polymer. In an embodiment, the polymer includes a fluoropolymer. In an embodiment, the fluoropolymer is selected from the group consisting of ethylene tetrafluoroethylene (ETFE), polyvinylidene fluoride (PVDF), tetrafluoroethylene-hexafluoropropylene copolymers (FEP), tetrafluoroethylene-hexafluoropropylene-vinylidene fluoride copolymers (THV), and blends thereof.

In an embodiment, the photovoltaic module 110 includes a backsheet 170 juxtaposed with a second surface 120 of the encapsulant 114. In an embodiment, the backsheet 170 includes a polymer. In an embodiment, the polymer includes a fluoropolymer. In the fluoropolymer is selected from the group consisting of ethylene tetrafluoroethylene (ETFE), polyvinylidene fluoride (PVDF), tetrafluoroethylene-hexafluoropropylene copolymers (FEP), tetrafluoroethylene-hexafluoropropylene-vinylidene fluoride copolymers (THV), and blends thereof. In another embodiment, the backsheet 170 includes thermoplastic polyolefin (TPO). In an embodiment, the backsheet 170 includes a single layer, moisture-resistant, fire-retardant membrane. In an embodiment, the backsheet 170 includes thermoplastic polyolefin (TPO). In another embodiment, the backsheet 170 includes a metal hydroxide. In an embodiment, the metal hydroxide includes an aluminum hydroxide. In another embodiment, the backsheet 170 includes polyvinyl chloride. In another embodiment, the backsheet 170 includes a first ply and a second ply. In other embodiments, the backsheet 170 includes a plurality of layers. In other embodiments, the photovoltaic module 10 may include more than one backsheet 170.

In an embodiment, the encapsulant 114 includes a structure and function similar to the encapsulant 14 as described above. In an embodiment, the frontsheet 116 includes a structure and function similar to the frontsheet 16 as described above. In an embodiment, the backsheet 170 includes a structure and function similar to the backsheet 170 as described above.

In an embodiment, the photovoltaic module 110 includes a first end 111, a second end 113 opposite the first end 111, a first surface 115 extending from the first end 111 to the second end 113, and a second surface 117 opposite the first surface 115 and extending from the first end 111 to the second end 113. In an embodiment, the encapsulant 114 includes a first layer 119 and a second layer 121.

In an embodiment, the photovoltaic module 110 includes a first electrical connector 131 electrically connected to the at least one solar cell 112. In an embodiment, the first electrical connector 131 is at least partially embedded within the encapsulant 114. In an embodiment, the photovoltaic module 110 includes a second electrical connector 133 electrically connected to the at least one solar cell 112. In an embodiment, the second electrical connector 133 freely extends from the encapsulant 114. In an embodiment, the first electrical connector 131 is located proximate to the first end 111 of the photovoltaic module 110. In an embodiment, the second electrical connector 133 is located at the second end 113 of the photovoltaic module 110. In an embodiment, the first electrical connector 131 extends from the first surface 115 of the photovoltaic module 110. In an embodiment, the first electrical connector 131 extends from the second surface 117 of the photovoltaic module 110. In an embodiment, the first electrical connector 131 extends from the first end 111 of the photovoltaic module 110. In an embodiment, the first electrical connector 131 is fixed within the encapsulant 114. In an embodiment, the second electrical connector 133 includes an electrical wire 136 located intermediate the first layer 119 and the second layer 121 of the encapsulant 114.

Referring to FIGS. 12A through 12C, in another embodiment, the photovoltaic module 110 includes a flap 135 located intermediate the first layer 119 and the second layer 121 of the encapsulant 114. In an embodiment, the flap 135 includes a free end 137. In an embodiment, the second electrical connector 133 is located on the free end 137 of the flap 135. In an embodiment, the second electrical connector 133 is movable. In an embodiment, the second electrical connector 133 is movable in three-dimensions. In an embodiment, the first electrical connector 131 is a male connector and the second electrical connector 133 is a female connector. In an embodiment, the first electrical connector 131 and second electrical connector 133 are removably connected to one another. In an embodiment, each of the first electrical connector 131 and the second electrical connector 133 is square-shaped. In another embodiment, each of the first electrical connector 131 and the second electrical connector 133 is circular-shaped. In another embodiment, each of the first electrical connector 131 and the second electrical connector 133 is rectangular-shaped. In another embodiment, each of the first electrical connector 131 and the second electrical connector 133 is triangular-shaped.

Figure 13:
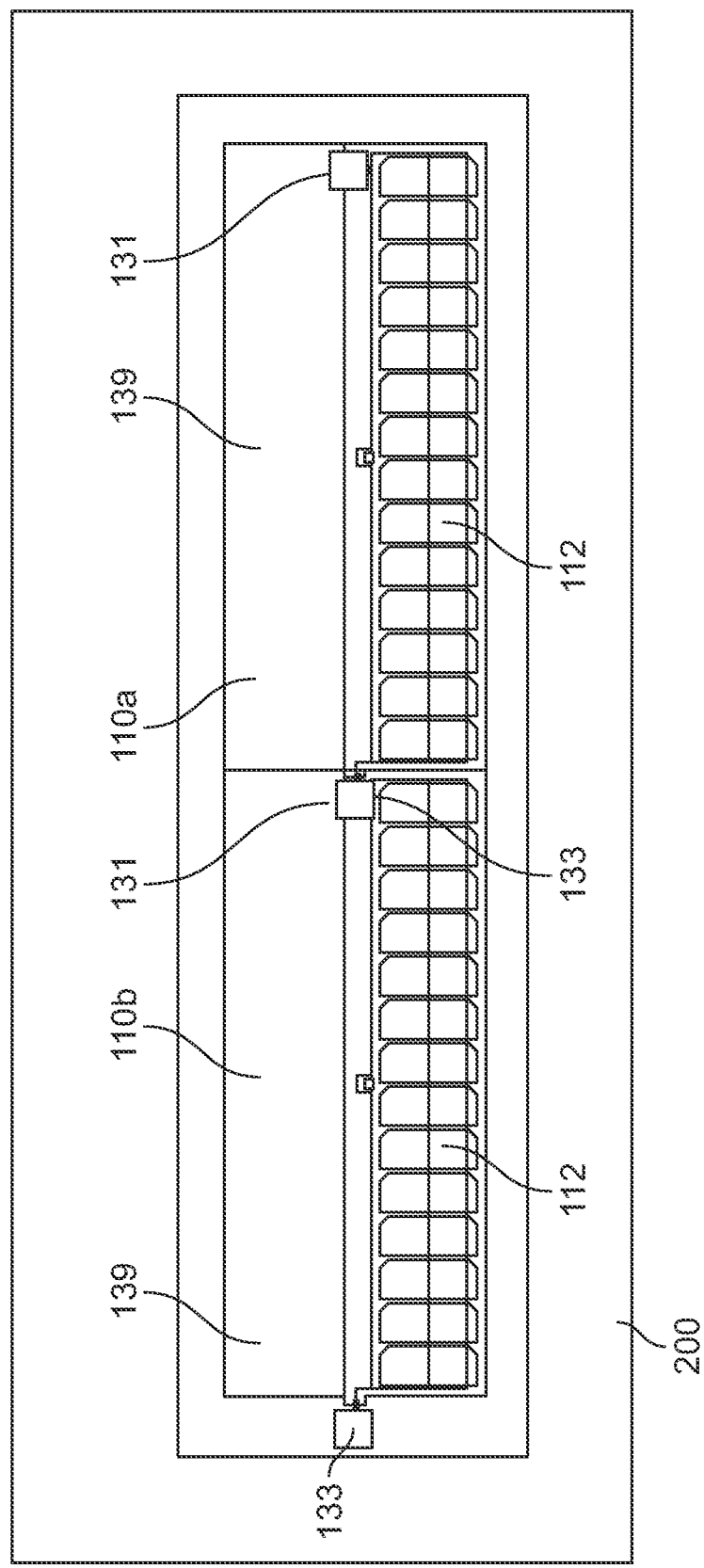
FIG. 13 is a top plan view of a plurality of photovoltaic modules of FIG. 9 connected to one another.
Figure 14:
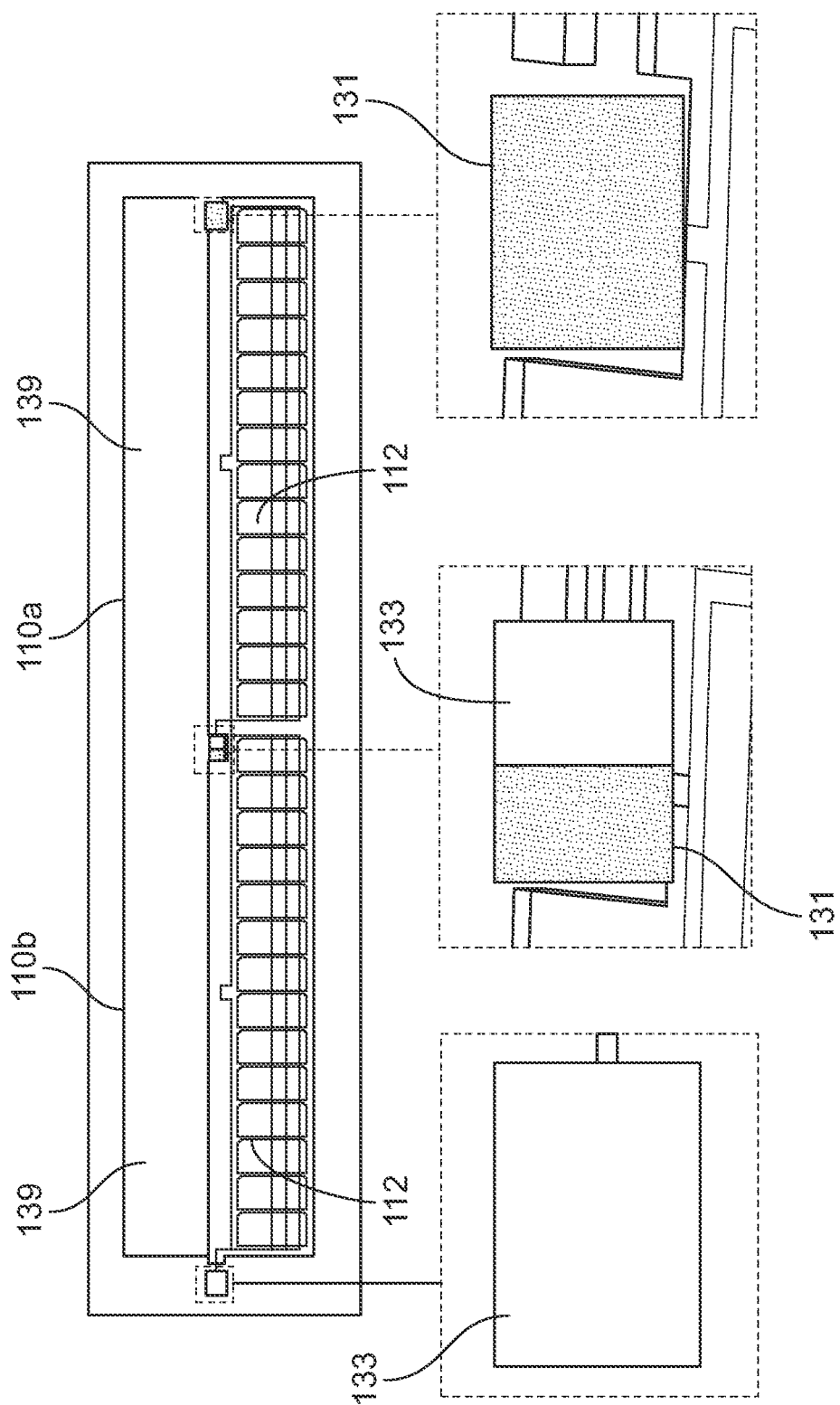
FIG. 14 is a top plan view of the connected photovoltaic modules of FIG. 13 including enlarged views of the electrical connectors employed by the modules.

In an embodiment, the photovoltaic module 110 is a solar shingle configured to be installed on a roof deck 200. Referring to FIGS. 13 and 14, in an embodiment, a first photovoltaic module 110a is configured to be installed proximate to a second photovoltaic module 110b. In an embodiment, the second electrical connector 133 of the first photovoltaic module 110a is configured to be connected to a first electrical connector 131 of the second photovoltaic module 110b. In an embodiment, the solar shingle includes a headlap 139 adjacent to the at least one solar cell 112. In an embodiment, the headlap 139 includes a polymer. In an embodiment, the headlap 139 includes thermoplastic polyolefin (TPO). In other embodiments, the headlap 139 is made of polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), or polyimide.

Figure 15:
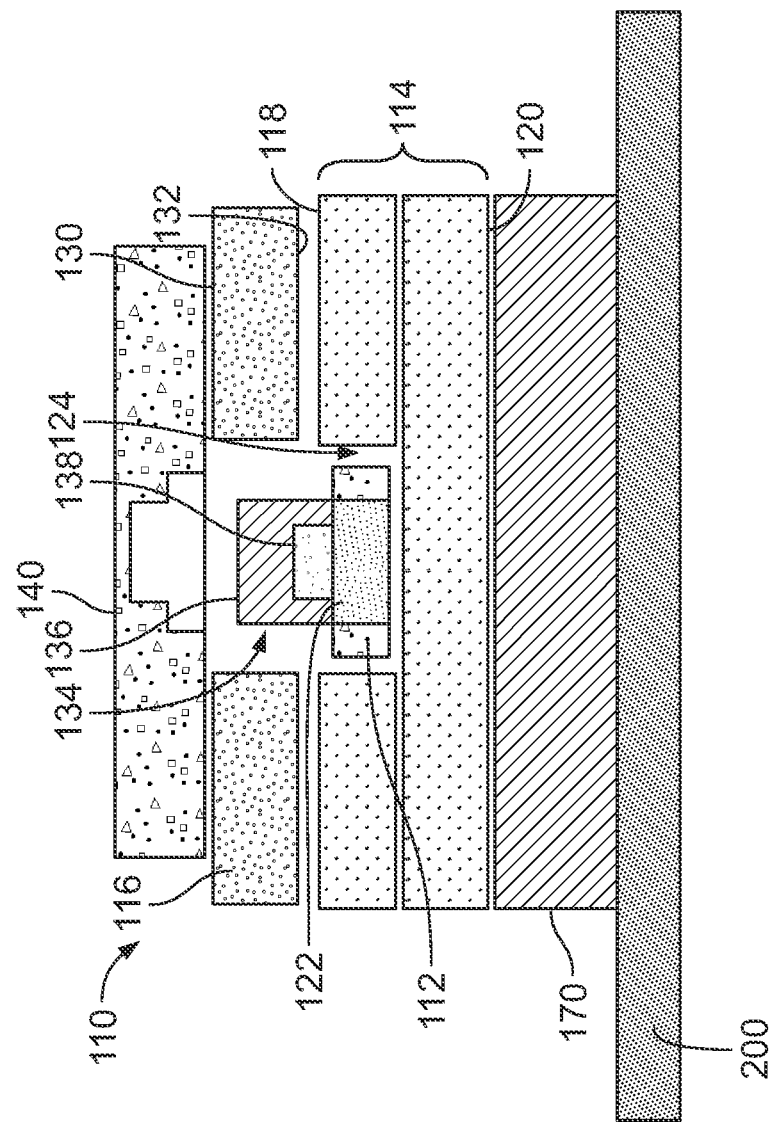
FIG. 15 is a schematic, side cross-sectional view of an embodiment of a photovoltaic module employing a cover of FIGS. 3A and 3B.

Referring to FIG. 15, in an embodiment, the at least one solar cell 112 includes an electrical bussing 122. In an embodiment, the encapsulant 114 includes a first surface 118 having at least one first opening 124. In an embodiment, the frontsheet 116 includes a first surface 130, a second surface 132 opposite the first surface 130, and at least one second opening 134 extending from the first surface 130 to the second surface 132. In an embodiment, the at least one second opening 134 of the frontsheet 116 is in fluid communication with the at least one first opening 124 of the encapsulant 114. In an embodiment, the electrical bussing 122 is positioned in the at least one first opening 124. In an embodiment, the wire 136 of the at least one first electrical connector 131 includes a first end 138 electrically connected to the electrical bussing 122. In an embodiment, the photovoltaic module 110 includes at least one cover 140 attached to the frontsheet 116. In an embodiment, the cover 140 covers the first end 138 of the wire 136 and the at least one first opening 124 and the at least one second opening 134.

Referring to FIG. 16A, in an embodiment, a photovoltaic module 210 includes a first electrical connector 231 having an electrical wire 236a with a first end 238a connected to electrical bussing of the module 210, and a second electrical connector 233 having an electrical wire 236b with a first end 238b connected to the electrical bussing. In an embodiment, a cover 240 covers the respective connection points of the first end 238a of the electrical wire 236a with the electrical bussing and the first end 238b of the electrical wire 236b with the electrical bussing. In an embodiment, the electrical connector 233 has a similar structure and function of the electrical connector 133 described above. In an embodiment, the cover 240 has a similar structure and function of the cover 40 described above. In an embodiment, the cover 240 has a similar structure and function of the cover 40 shown in FIG. 7B.

Referring to FIG. 16B, in an embodiment, a photovoltaic module 310 includes a first electrical connector 331 having an electrical wire 336a with a first end 338a connected to electrical bussing of the module 310, and a second electrical connector 333 having an electrical wire 336b with a first end 338b connected to the electrical bussing. In an embodiment, a first cover 340a covers the connection point of the first end 338a of the electrical wire 336a with the electrical bussing, and a second cover 340b covers the connection point of the first end 338b of the electrical wire 336b with the electrical bussing. In an embodiment, the each of the covers 340a, 340b has a similar structure and function of the cover 40 described above.

Referring to FIG. 16C, in an embodiment, a photovoltaic module 410 includes a first electrical connector 431 connected to electrical bussing of the module 410, and a second electrical connector 433 having an electrical wire 436b with a first end 438b connected to the electrical bussing. In an embodiment, a cover 440 covers a connection point of the first end 438b of the electrical wire 436b with the electrical bussing. In an embodiment, the electrical connector 433 has a similar structure and function of the first electrical connector 133 described above. In an embodiment, the cover 440 has a similar structure and function of the cover 40 described above.

Referring to FIG. 17, in an embodiment, a photovoltaic module 510 includes a first end 511, a second end 513 opposite the first end 511, a first side 512 extending between the first end 511 and the second end 513, and a second side 514 opposite the first side 512 and extending between the first end 511 and the second end 513. In an embodiment, the photovoltaic module 510 includes a first electrical connector 531 and a second electrical connector 533. In an embodiment, the first electrical connector 531 and the second electrical connector 533 are connected to electrical bussing of the photovoltaic module 510. In an embodiment, each of the first and second electrical connectors 531, 533 includes a first end 535, a second end 537 opposite the first end 535, a first side 539 extending from the first end 535 to the second end 537, and a second side 541 opposite the first side 539 and extending from the first end 535 to the second end 537. In an embodiment, each of the first and second electrical connectors 531, 533 includes a first port 543 and a second port 545. In an embodiment, each of the first ports 543 is located at the first end 535 of the corresponding first and second electrical connectors 531, 533, and each of the second ports 545 is located at the first side 539 of the corresponding first and second electrical connectors 531, 533.

Still referring to FIG. 17, in an embodiment, the first electrical connector 531 is positioned on the first side 512. In an embodiment, the first electrical connector 531 is positioned proximate to the first end 511. In an embodiment, the second electrical connector 533 is positioned on the first side 512. In an embodiment, the second electrical connector 533 is distal from the first electrical connector 531. In an embodiment, the second electrical connector 533 is positioned proximate to the second end 513. In an embodiment, the first port 543 of the first electrical connector 531 is proximate to the first end 511, and the first port 543 of the second electrical connector 533 is proximate to the second end 513. In an embodiment, the photovoltaic module 510 is configured to be installed on a roof deck.

Figure 18:
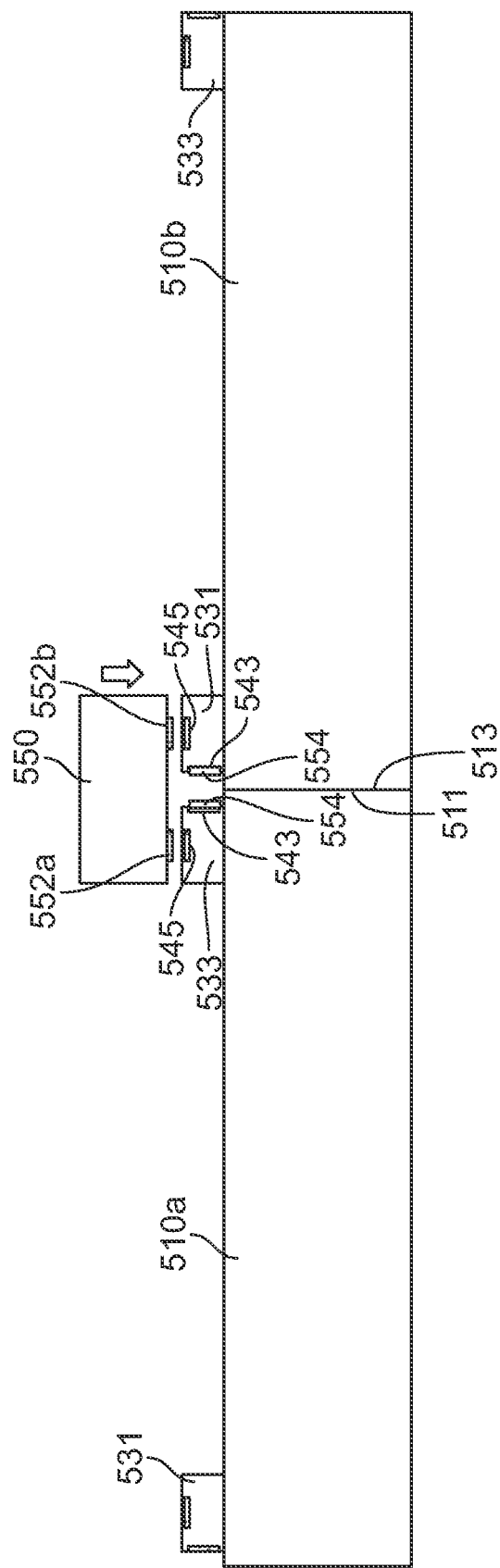
FIG. 18 is a schematic view of an embodiment of a photovoltaic system.

Referring to FIG. 18, in an embodiment, a system includes a first photovoltaic module 510a and a second photovoltaic module 510b. In an embodiment, each of the first and second photovoltaic modules 510a, 510b includes a structure similar to that of the photovoltaic module 510 as described above. In an embodiment, the first and second photovoltaic modules 510a, 510b are positioned adjacent to one another such that the second end 513 of the first photovoltaic module 510a is proximate to the first end 511 of the second photovoltaic module 510b, and the second electrical connector 533 of the first photovoltaic module 510a is proximate to the first electrical connector 531 of the second photovoltaic module 510b. In an embodiment, the system includes an electrical jumper 550 having a pair of terminals 552a, 552b. In an embodiment, the second electrical connector 533 of the first photovoltaic module 510a and the first electrical connector 531 of the second photovoltaic module 510b are configured to receive the electrical jumper 550, such that the terminal 552a is connected to (e.g., plugged into) the second port 545 of the second electrical connector 533 of the first photovoltaic module 510a, and the terminal 552b is connected to (e.g., plugged into) the second port 545 of the first electrical connector 531 of the second photovoltaic module 510b. In an embodiment, the jumper 550 facilitates an electrical connection between the first and second photovoltaic modules 510a, 510b. In an embodiment, the jumper 550 is removable from the second electrical connector 533 of the first photovoltaic module 510a and the first electrical connector 531 of the second photovoltaic module 510b. In an embodiment, each of the unused first ports 543 of the second electrical connector 533 of the first photovoltaic module 510a and the first electrical connector 531 of the second photovoltaic module 510b is sized and shaped to receive a cap 554. In an embodiment, the cap 554 plugs the first ports 543 to prevent the intrusion of external water, debris, insects or other objects therein. In an embodiment, any of the first and second ports 543, 545 that are not used is configured to receive a corresponding one of the caps 554. In an embodiments, the caps 554 are removably received within the ports 543, 545.

Referring to FIG. 19A, in another embodiment, a system includes the first photovoltaic module 510a and the second photovoltaic module 510b. In an embodiment, the second photovoltaic module 510b overlaps the first photovoltaic module 510a. In an embodiment, the second side 514 of the second photovoltaic module 510b overlaps the first side 512 of the first photovoltaic module 510a. In an embodiment, the first end 511 of the second photovoltaic module 510b is substantially aligned with the first end 511 of the first photovoltaic module 510a, while the second end 513 of the second photovoltaic module 510b is substantially aligned with the second end 513 of the first photovoltaic module 510a. In an embodiment, the corresponding first electrical connectors 531 of the first and second photovoltaic modules 510a, 510b are substantially aligned with one another, while the second electrical connectors 533 of the first and second photovoltaic modules 510a, 510b are substantially aligned with one another. In an embodiment, the second electrical connector 533 of the first photovoltaic module 510a and the second electrical connector 533 of the second photovoltaic module 510b receive the electrical jumper 550, such that the terminal 552b is connected to (e.g., plugged into) the first port 543 of the second electrical connector 533 of the first photovoltaic module 510a, and the terminal 552a is connected to (e.g., plugged into) the first port 543 of the second electrical connector 533 of the second photovoltaic module 510b. In an embodiment, each of the unused second ports 545 of the second electrical connector 533 of the first photovoltaic module 510a and the second electrical connector 533 of the second photovoltaic module 510b is sized and shaped to receive a corresponding one of the caps 554. In an embodiment, each of the unused first and second ports 543, 545 of the first electrical connector 531 of the first photovoltaic module 510a and the first electrical connector 531 of the second photovoltaic module 510b is sized and shaped to receive a corresponding one of the caps 554.

Referring to FIG. 19B, in an embodiment, the first electrical connector 531 of the first photovoltaic module 510a and the first electrical connector 531 of the second photovoltaic module 510b receive the electrical jumper 550, such that the terminal 552a is connected to (e.g., plugged into) the first port 543 of the first electrical connector 531 of the first photovoltaic module 510a, and the terminal 552b is connected to (e.g., plugged into) the first port 543 of the first electrical connector 531 of the second photovoltaic module 510b. In an embodiment, each of the unused second ports 545 of the first electrical connector 531 of the first photovoltaic module 510a and the first electrical connector 531 of the second photovoltaic module 510b is sized and shaped to receive a corresponding one of the caps 554. In an embodiment, each of the unused first and second ports 543, 545 of the second electrical connector 533 of the first photovoltaic module 510a and the second electrical connector 533 of the second photovoltaic module 510b is sized and shaped to receive a corresponding one of the caps 554.

Figure 20:
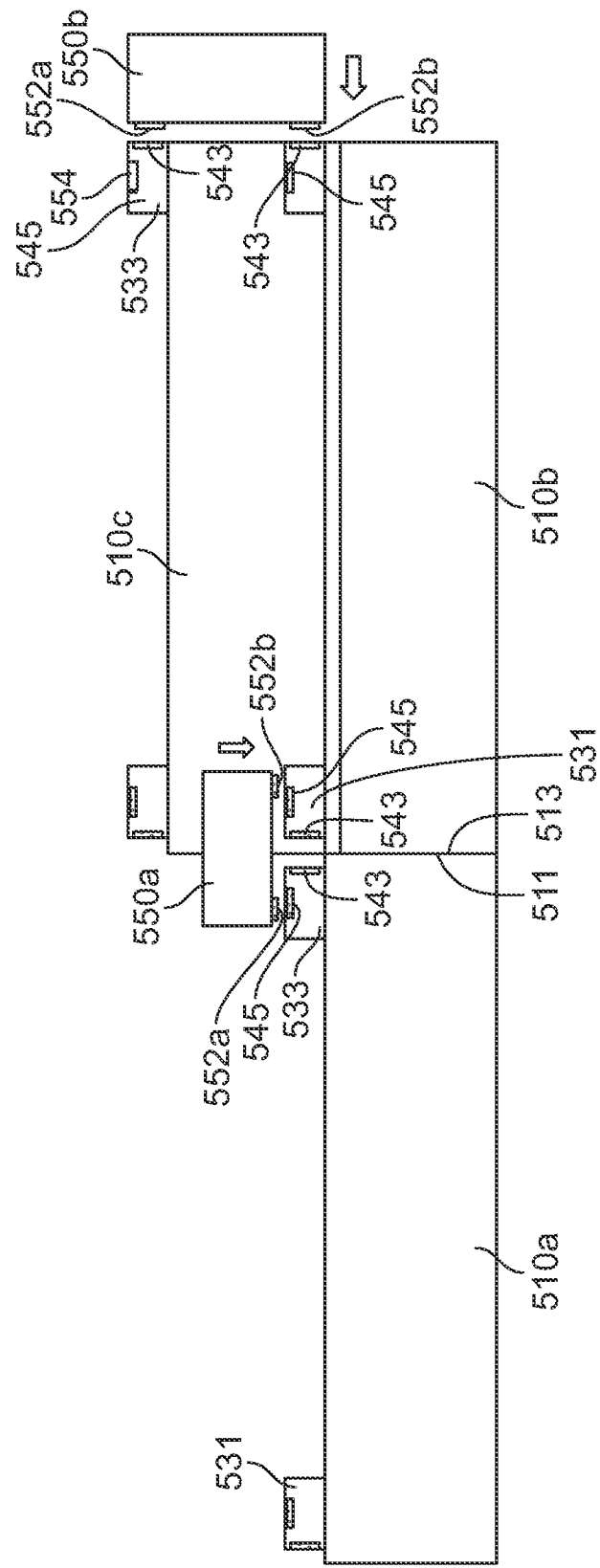
FIG. 20 is a schematic view of an embodiment of a photovoltaic system.

Referring to FIG. 20, in an embodiment, a system includes a first photovoltaic module 510a, a second photovoltaic module 510b, and a third photovoltaic module 510c. In an embodiment, each of the first, second, and third photovoltaic modules 510a, 510b, 510c includes a structure similar to that of the photovoltaic module 510 as described above. In an embodiment, the first and second photovoltaic modules 510a, 510b are positioned adjacent to one another such that the second end 513 of the first photovoltaic module 510a is proximate to the first end 511 of the second photovoltaic module 510b, and the second electrical connector 533 of the first photovoltaic module 510a is proximate to the first electrical connector 531 of the second photovoltaic module 510b. In an embodiment, the second electrical connector 533 of the first photovoltaic module 510a and the first electrical connector 531 of the second photovoltaic module 510b receive a first electrical jumper 550a, such that the terminal 552a is connected to (e.g., plugged into) the second port 545 of the second electrical connector 533 of the first photovoltaic module 510a, and the terminal 552b is connected to (e.g., plugged into) the second port 545 of the first electrical connector 531 of the second photovoltaic module 510b. In an embodiment, the first jumper 550a facilitates an electrical connection between the first and second photovoltaic modules 510a, 510b.

Still referring to FIG. 20, in an embodiment, the third photovoltaic module 510c overlaps the second photovoltaic module 510b. In an embodiment, the second side 514 of the third photovoltaic module 510c overlaps the first side 512 of the second photovoltaic module 510b. In an embodiment, the first end 511 of the third photovoltaic module 510c is substantially aligned with the first end 511 of the second photovoltaic module 510b, while the second end 513 of the third photovoltaic module 510c is substantially aligned with the second end 513 of the second photovoltaic module 510b. In an embodiment, the corresponding first electrical connectors 531 of the second and third photovoltaic modules 510b, 510c are substantially aligned with one another, while the second electrical connectors 533 of the second and third photovoltaic modules 510b, 510c are substantially aligned with one another. In an embodiment, the second electrical connector 533 of the second photovoltaic module 510b and the second electrical connector 533 of the third photovoltaic module 510c receive a second electrical jumper 550b, such that the terminal 552b is connected to (e.g., plugged into) the first port 543 of the second electrical connector 533 of the second photovoltaic module 510b, and the terminal 552a is connected to (e.g., plugged into) the first port 543 of the second electrical connector 533 of the third photovoltaic module 510c. In an embodiment, the second jumper 550b facilitates an electrical connection between the second and third photovoltaic modules 510b, 510c. In an embodiment, each of the unused first and second ports 543, 545 of the first and second electrical connectors 531, 533 of the first, second and third photovoltaic modules 510a, 510b, 510c is sized and shaped to receive a corresponding one of the caps 554.

In an embodiment, a method of installing a photovoltaic system includes the following steps:

Obtaining a first photovoltaic module and a second photovoltaic module, wherein each of the first photovoltaic module and the second photovoltaic module includes at least one solar cell having an electrical bussing, an encapsulant encapsulating the at least one solar cell, wherein the encapsulant includes a first surface having at least one first opening, and a frontsheet juxtaposed with the first surface of the encapsulant, wherein the frontsheet includes a first surface, a second surface opposite the first surface of the frontsheet, and at least one second opening extending from the first surface of the frontsheet to the second surface of the frontsheet, wherein the at least one second opening of the frontsheet is in fluid communication with the at least one first opening of the encapsulant, and wherein the electrical bussing is positioned in the at least one first opening, and at least one first electrical connector having a wire with a first end electrically connected to the electrical bussing;

Installing the first photovoltaic module and the second photovoltaic module on a roof deck; and Connecting the at least one electrical connector of the first photovoltaic module to the second photovoltaic module.

In an embodiment, the method of installing the photovoltaic system may include the step of installing a cover to the frontsheet and covering the first end of the wire and the at least one first opening and the at least one second opening with the cover. In an embodiment, the method of installing the photovoltaic system may include the step of installing at least one strain relief on at least one of the first and second photovoltaic modules, wherein the at least one strain relief is configured to receive the corresponding wire.

Figure 21B:
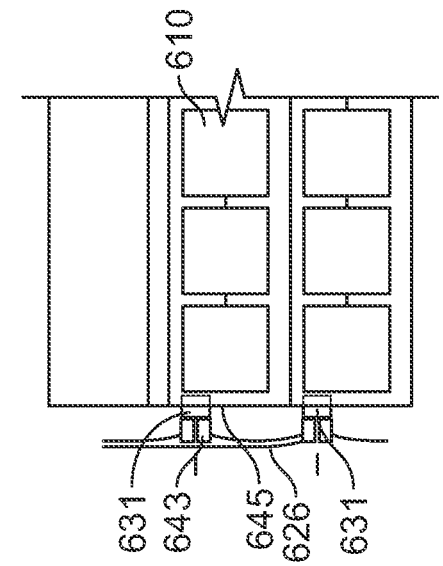
FIGS. 21A through 21C illustrate an embodiment of a photovoltaic system.
Figure 21A:
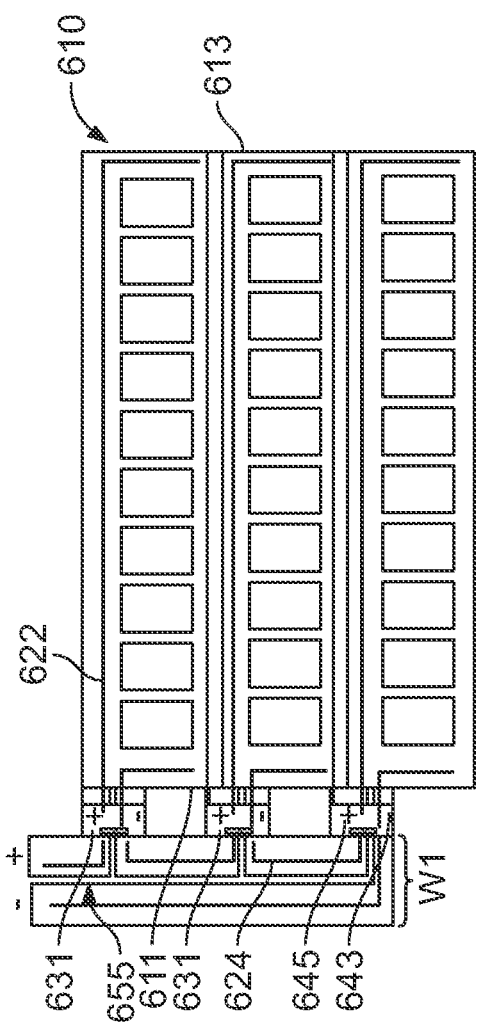

Referring to FIGS. 21A and 21B, in an embodiment, a system includes a plurality of photovoltaic modules 610, each of which includes a first end 611 and a second end 613 opposite the first end 611. In an embodiment, each of the photovoltaic modules 610 includes an electrical connector 631. In an embodiment, the electrical connector 631 is connected to electrical bussing 622 of the photovoltaic module 610. In an embodiment, the electrical connector 631 is connected to the electrical bussing 622 at the first end 611. In another embodiment, the electrical connector 631 is connected to electrical bussing 622 of the photovoltaic module 610 at the second end 613. In an embodiment, the electrical connector 631 includes a first port 643 and a second port 645. In an embodiment, the first port 643 is a negative port and the second port 645 is a positive port. In another embodiment, the first port 643 is a positive port and the second port 645 is a negative port. In an embodiment, the second port 645 of one of the photovoltaic modules 610 is electrically connected to the first port 643 of an adjacent one of another of the photovoltaic modules 610. In another embodiment, the second port 645 of one of the photovoltaic modules 610 is electrically connected to the first port 643 of an adjacent one of another of the photovoltaic modules 610 by electrical bussing 624 (see FIG. 21A). In an embodiment, the second port 645 of one of the photovoltaic modules 610 is electrically connected to the first port 643 of an adjacent one of another of the photovoltaic modules 610 by an electrical wire 626 (see FIG. 21B).

Figure 21C:
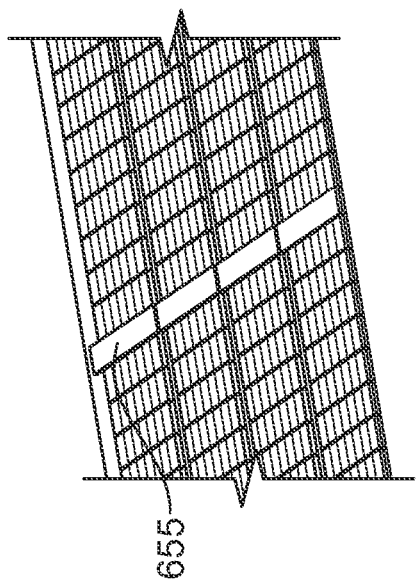

Referring to FIG. 21C, in an embodiment, the electrical connector 631 is located within a wire channel 655. In an embodiment, the wire channel 655 is located proximate to the first end 611 of the photovoltaic module 610. In another embodiment, the wire channel 655 is located proximate to the second end 613 of the photovoltaic module 610. In an embodiment, the wire channel 655 includes a width W1 of 1 inch to 5 inches. In an embodiment, the wire channel 655 includes a width W1 of 1 inch to 4 inches. In an embodiment, the wire channel 655 includes a width W1 of 1 inch to 3 inches. In an embodiment, the wire channel 655 includes a width W1 of 1 inch to 2 inches. In an embodiment, the wire channel 655 includes a width W1 of 2 inches to 5 inches. In an embodiment, the wire channel 655 includes a width W1 of 2 inches to 4 inches. In an embodiment, the wire channel 655 includes a width W1 of 2 inches to 3 inches. In an embodiment, the wire channel 655 includes a width W1 of 3 inches to 5 inches. In an embodiment, the wire channel 655 includes a width W1 of 3 inches to 4 inches. In an embodiment, the wire channel 655 includes a width W1 of 4 inches to 5 inches.

In an embodiment, the wire channel 655 includes a width W1 of 1 inch. In an embodiment, the wire channel 655 includes a width W1 of 2 inches. In an embodiment, the wire channel 655 includes a width W1 of 3 inches. In an embodiment, the wire channel 655 includes a width W1 of 4 inches. In an embodiment, the wire channel 655 includes a width W1 of 5 inches.

In an embodiment, the wire channel 655 includes a height H1 of 5 mm to 15 mm. In an embodiment, the wire channel 655 includes a height H1 of 5 mm to 10 mm. In an embodiment, the wire channel 655 includes a height H1 of 10 mm to 15 mm. In an embodiment, the wire channel 655 includes a height H1 of 5 mm. In an embodiment, the wire channel 655 includes a height H1 of 10 mm. In an embodiment, the wire channel 655 includes a height H1 of 15 mm.

Referring to FIGS. 22A through 22D, in an embodiment, a system includes a plurality of photovoltaic modules 710, each of which includes a first end 711 and a second end 713 opposite the first end 711, and a headlap 739 extending from a first end 702 to a second end 704. In an embodiment, the first end 702 is offset from the first end 711. In an embodiment, the second end 704 is offset from the second end 713. In an embodiment, each of the photovoltaic modules 710 includes an electrical connector 731. In an embodiment, the electrical connector 731 is connected to electrical bussing 722 of the photovoltaic module 710. In an embodiment, the electrical connector 731 is connected to the electrical bussing 722 at the first end 702. In an embodiment, the electrical connector 731 is connected to the electrical bussing 722 at the second end 704. In an embodiment, the electrical connector 731 includes a busbar portion 741, a first port 743 and a second port 745, each of the first port 743 and the second port 745 being opposite the busbar portion 741. In an embodiment, the first port 743 and the second port 745 are spaced apart from one another.

In an embodiment, the busbar portion 741 includes a height H1 of 0.5 mm to 2 mm. In an embodiment, the busbar portion 741 includes a height H1 of 0.5 mm to 1.5 mm. In an embodiment, the busbar portion 741 includes a height H1 of 0.5 mm to 1 mm. In an embodiment, the busbar portion 741 includes a height H1 of 1 mm to 2 mm. In an embodiment, the busbar portion 741 includes a height H1 of 1 mm to 1.5 mm. In an embodiment, the busbar portion 741 includes a height H1 of 1.5 mm to 2 mm. In an embodiment, the busbar portion 741 includes a height H1 of 0.5 mm. In an embodiment, the busbar portion 741 includes a height H1 of 1 mm. In an embodiment, the busbar portion 741 includes a height H1 of 1.5 mm. In an embodiment, the busbar portion 741 includes a height H1 of 2 mm.

In an embodiment, each of the first port 743 and the second port 745 includes a height H2 of 1 mm to 10 mm. In an embodiment, each of the first port 743 and the second port 745 includes a height H2 of 1 mm to 9 mm. In an embodiment, each of the first port 743 and the second port 745 includes a height H2 of 1 mm to 8 mm. In an embodiment, each of the first port 743 and the second port 745 includes a height H2 of 1 mm to 7 mm. In an embodiment, each of the first port 743 and the second port 745 includes a height H2 of 1 mm to 6 mm. In an embodiment, each of the first port 743 and the second port 745 includes a height H2 of 1 mm to 5 mm. In an embodiment, each of the first port 743 and the second port 745 includes a height H2 of 1 mm to 4 mm. In an embodiment, each of the first port 743 and the second port 745 includes a height H2 of 1 mm to 3 mm. In an embodiment, each of the first port 743 and the second port 745 includes a height H2 of 1 mm to 2 mm.

In an embodiment, each of the first port 743 and the second port 745 includes a height H2 of 2 mm to 10 mm. In an embodiment, each of the first port 743 and the second port 745 includes a height H2 of 2 mm to 9 mm. In an embodiment, each of the first port 743 and the second port 745 includes a height H2 of 2 mm to 8 mm. In an embodiment, each of the first port 743 and the second port 745 includes a height H2 of 2 mm to 7 mm. In an embodiment, each of the first port 743 and the second port 745 includes a height H2 of 2 mm to 6 mm. In an embodiment, each of the first port 743 and the second port 745 includes a height H2 of 2 mm to 5 mm. In an embodiment, each of the first port 743 and the second port 745 includes a height H2 of 2 mm to 4 mm. In an embodiment, each of the first port 743 and the second port 745 includes a height H2 of 2 mm to 3 mm.

In an embodiment, each of the first port 743 and the second port 745 includes a height H2 of 3 mm to 10 mm. In an embodiment, each of the first port 743 and the second port 745 includes a height H2 of 3 mm to 9 mm. In an embodiment, each of the first port 743 and the second port 745 includes a height H2 of 3 mm to 8 mm. In an embodiment, each of the first port 743 and the second port 745 includes a height H2 of 3 mm to 7 mm. In an embodiment, each of the first port 743 and the second port 745 includes a height H2 of 3 mm to 6 mm. In an embodiment, each of the first port 743 and the second port 745 includes a height H2 of 3 mm to 5 mm. In an embodiment, each of the first port 743 and the second port 745 includes a height H2 of 3 mm to 4 mm.

In an embodiment, each of the first port 743 and the second port 745 includes a height H2 of 4 mm to 10 mm. In an embodiment, each of the first port 743 and the second port 745 includes a height H2 of 4 mm to 9 mm. In an embodiment, each of the first port 743 and the second port 745 includes a height H2 of 4 mm to 8 mm. In an embodiment, each of the first port 743 and the second port 745 includes a height H2 of 4 mm to 7 mm. In an embodiment, each of the first port 743 and the second port 745 includes a height H2 of 4 mm to 6 mm. In an embodiment, each of the first port 743 and the second port 745 includes a height H2 of 4 mm to 5 mm.

In an embodiment, each of the first port 743 and the second port 745 includes a height H2 of 5 mm to 10 mm. In an embodiment, each of the first port 743 and the second port 745 includes a height H2 of 5 mm to 9 mm. In an embodiment, each of the first port 743 and the second port 745 includes a height H2 of 5 mm to 8 mm. In an embodiment, each of the first port 743 and the second port 745 includes a height H2 of 5 mm to 7 mm. In an embodiment, each of the first port 743 and the second port 745 includes a height H2 of 5 mm to 6 mm.

In an embodiment, each of the first port 743 and the second port 745 includes a height H2 of 6 mm to 10 mm. In an embodiment, each of the first port 743 and the second port 745 includes a height H2 of 6 mm to 9 mm. In an embodiment, each of the first port 743 and the second port 745 includes a height H2 of 6 mm to 8 mm. In an embodiment, each of the first port 743 and the second port 745 includes a height H2 of 6 mm to 7 mm. In an embodiment, each of the first port 743 and the second port 745 includes a height H2 of 7 mm to 10 mm. In an embodiment, each of the first port 743 and the second port 745 includes a height H2 of 7 mm to 9 mm. In an embodiment, each of the first port 743 and the second port 745 includes a height H2 of 7 mm to 8 mm. In an embodiment, each of the first port 743 and the second port 745 includes a height H2 of 8 mm to 10 mm. In an embodiment, each of the first port 743 and the second port 745 includes a height H2 of 8 mm to 9 mm. In an embodiment, each of the first port 743 and the second port 745 includes a height H2 of 9 mm to 10 mm.

In an embodiment, each of the first port 743 and the second port 745 includes a height H2 of 1 mm. In an embodiment, each of the first port 743 and the second port 745 includes a height H2 of 2 mm. In an embodiment, each of the first port 743 and the second port 745 includes a height H2 of 3 mm. In an embodiment, each of the first port 743 and the second port 745 includes a height H2 of 4 mm. In an embodiment, each of the first port 743 and the second port 745 includes a height H2 of 5 mm. In an embodiment, each of the first port 743 and the second port 745 includes a height H2 of 6 mm. In an embodiment, each of the first port 743 and the second port 745 includes a height H2 of 7 mm. In an embodiment, each of the first port 743 and the second port 745 includes a height H2 of 8 mm. In an embodiment, each of the first port 743 and the second port 745 includes a height H2 of 9 mm. In an embodiment, each of the first port 743 and the second port 745 includes a height H2 of 10 mm.

In an embodiment, the first port 743 is a negative port and the second port 745 is a positive port. In another embodiment, the first port 743 is a positive port and the second port 745 is a negative port. In an embodiment, the second port 745 of one of the photovoltaic modules 710 is electrically connected to the first port 743 of an adjacent one of another of the photovoltaic modules 710. In another embodiment, the second port 745 of one of the photovoltaic modules 710 is electrically connected to the first port 743 of an adjacent one of another of the photovoltaic modules 710 by electrical bussing 724. In an embodiment, the second port 745 of one of the photovoltaic modules 710 is electrically connected to the first port 743 of an adjacent one of another of the photovoltaic modules 710 by an electrical wire.

Figure 22C:
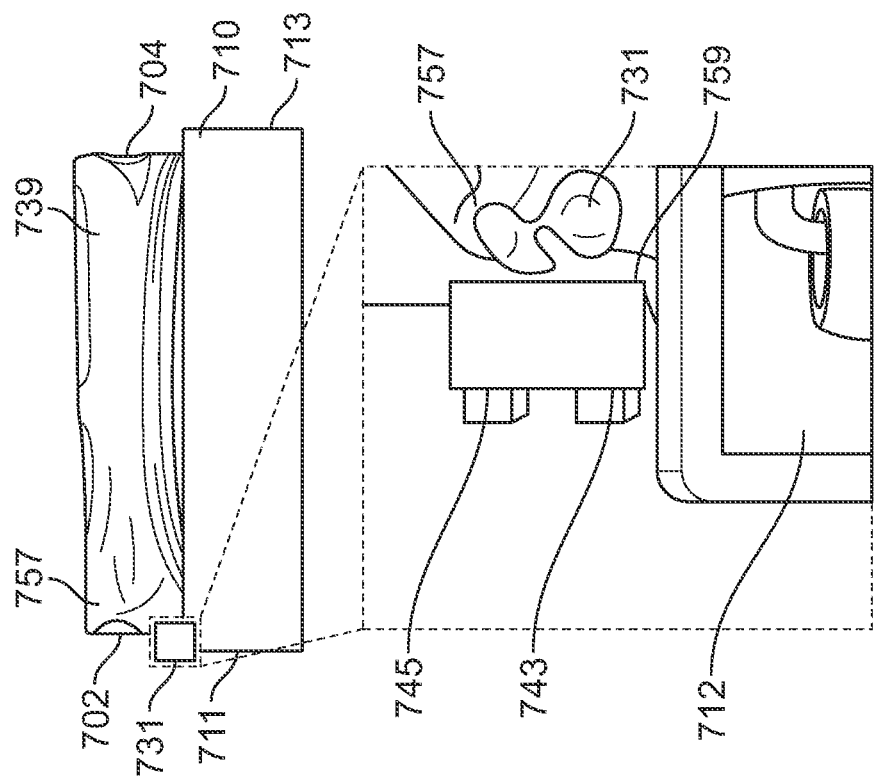
FIGS. 22A through 22E illustrate an embodiment of a photovoltaic system employing an embodiment of a connector.
Figure 22A:
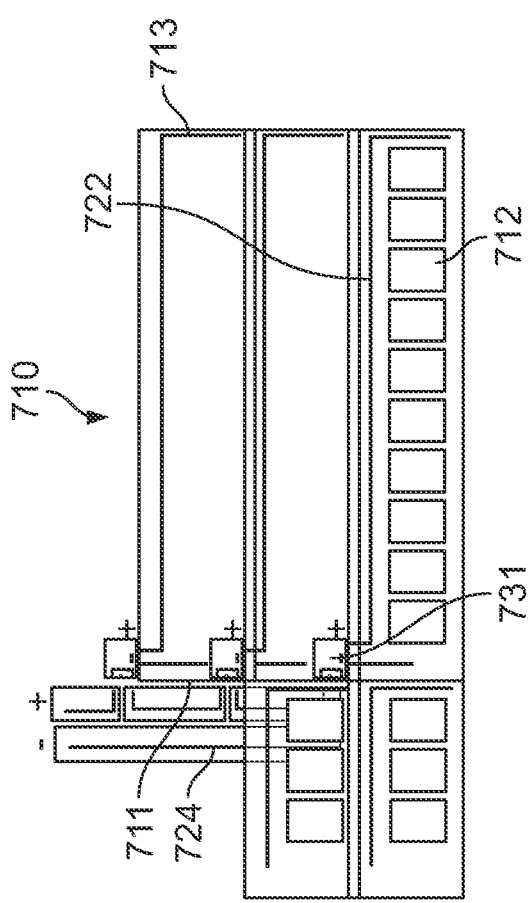
Figure 22B:
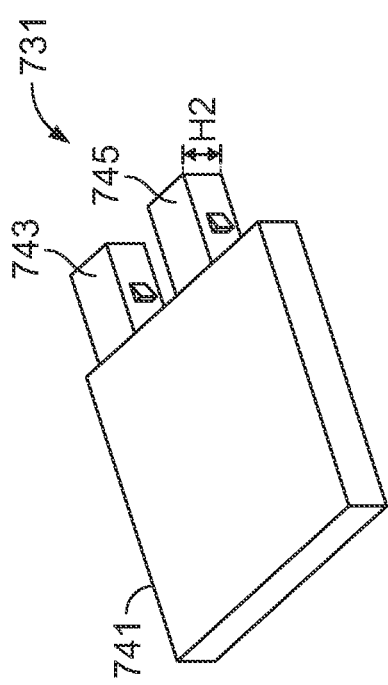
Figure 22D:
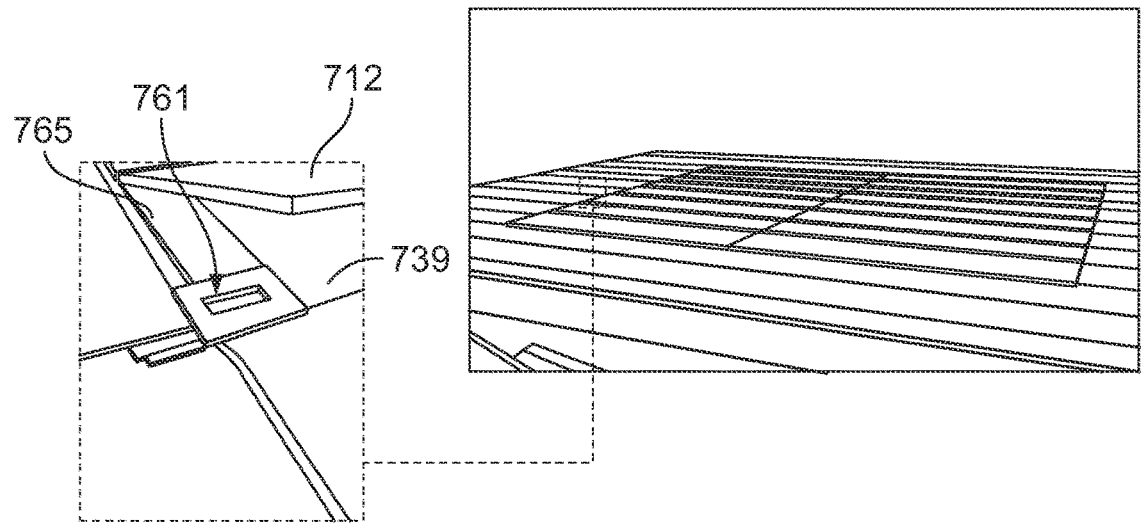

In an embodiment, the electrical connector 731 is positioned within the headlap 739. In an embodiment, the electrical connector 731 is laminated within the headlap 739 between a first layer 757 and a second layer 759 of the headlap 739. In an embodiment, the busbar portion 741 is positioned intermediate the first layer 757 and the second layer 759. In an embodiment, the first port 743 and the second port 745 extends outwardly from the first end 702 of the headlap 739. In another embodiment, the first port 743 and the second port 745 extends outwardly from the second end 704 of the headlap 739. In an embodiment, when the photovoltaic modules 710 are overlapped on top of one another, a gap area 761 is formed intermediate the headlap 739 of one of the photovoltaic modules 710 and a solar cell area 712 of another of the photovoltaic modules 710 overlapping the one of the photovoltaic modules 710. Referring to FIG. 22D, in an embodiment, the electrical connector 731 is located within the gap area 761. In an embodiment, the electrical connector 731 located within the gap area 761 does not impact the positioning, and more particularly, a height, of each of the photovoltaic modules 710 relative to the roof deck.

Figure 22E:
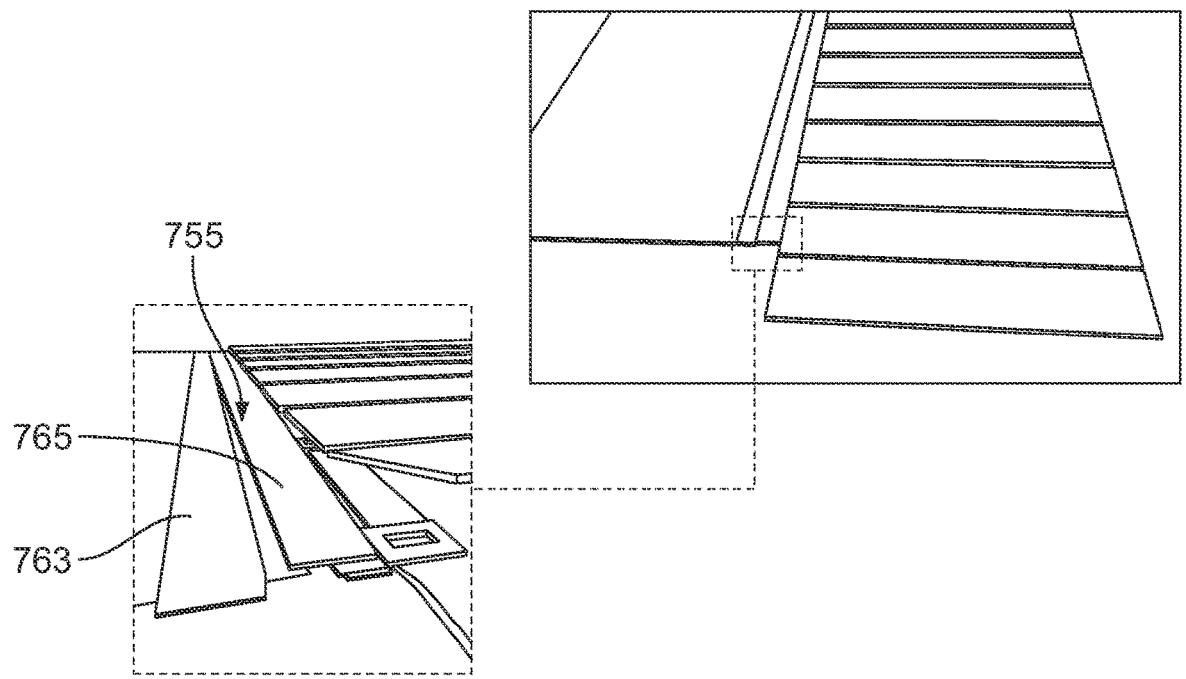
Figure 23A:
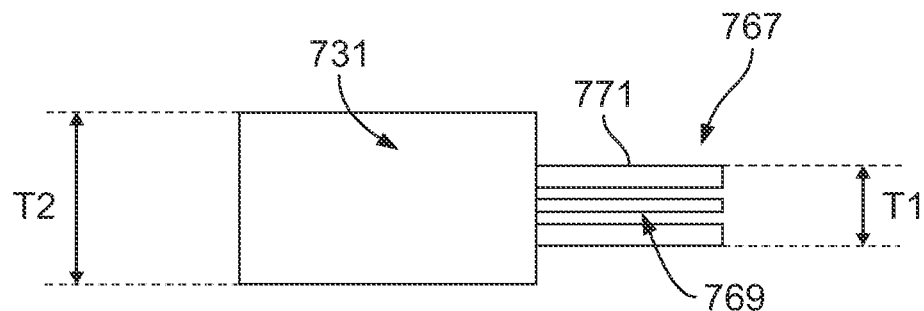
FIGS. 23A and 23B illustrate an embodiment of an electrical connector.
Figure 23B:
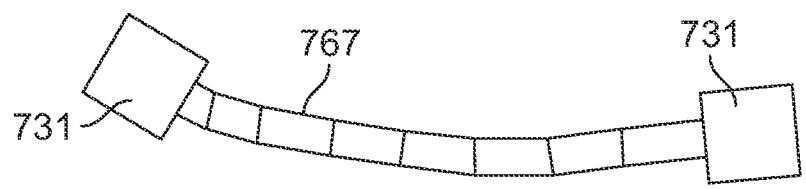

Referring to FIGS. 22D and 22E, in an embodiment, the system includes a return 763 and a jumper 765. In an embodiment, the return 763 includes a flat profile. In an embodiment, the jumper 765 includes a flat profile. In an embodiment, the return 763 is a flat ribbon cable. In an embodiment, the jumper 765 is a flat ribbon cable. In an embodiment, the return 763 and the jumper 765 enable a low profile connection between the photovoltaic modules 710 along a wire channel 755. Referring to FIGS. 23A and 23B, a flat ribbon portion 767 of the return 763 and/or the jumper 765 can be integrated with the electrical connector 731. In an embodiment, the flat ribbon portion 767 is overmolded into the electrical connector 731. In an embodiment, the flat ribbon portion 767 includes an electrical conductor 769. In an embodiment, the electrical conductor 769 includes bussing. In an embodiment, the electrical conductor 769 includes an electrical wire. In an embodiment, the electrical conductor 769 includes copper. In an embodiment, the flat ribbon portion 767 includes a polymer covering 771.

In an embodiment, the flat ribbon portion 767 includes a thickness T1 of 1 mm to 10 mm. In an embodiment, the flat ribbon portion 767 includes a thickness T1 of 1 mm to 9 mm. In an embodiment, the flat ribbon portion 767 includes a thickness T1 of 1 mm to 8 mm. In an embodiment, the flat ribbon portion 767 includes a thickness T1 of 1 mm to 7 mm. In an embodiment, the flat ribbon portion 767 includes a thickness T1 of 1 mm to 6 mm. In an embodiment, the flat ribbon portion 767 includes a thickness T1 of 1 mm to 5 mm. In an embodiment, the flat ribbon portion 767 includes a thickness T1 of 1 mm to 4 mm. In an embodiment, the flat ribbon portion 767 includes a thickness T1 of 1 mm to 3 mm. In an embodiment, the flat ribbon portion 767 includes a thickness T1 of 1 mm to 2 mm.

In an embodiment, the flat ribbon portion 767 includes a thickness T1 of 2 mm to 10 mm. In an embodiment, the flat ribbon portion 767 includes a thickness T1 of 2 mm to 9 mm. In an embodiment, the flat ribbon portion 767 includes a thickness T1 of 2 mm to 8 mm. In an embodiment, the flat ribbon portion 767 includes a thickness T1 of 2 mm to 7 mm. In an embodiment, the flat ribbon portion 767 includes a thickness T1 of 2 mm to 6 mm. In an embodiment, the flat ribbon portion 767 includes a thickness T1 of 2 mm to 5 mm. In an embodiment, the flat ribbon portion 767 includes a thickness T1 of 2 mm to 4 mm. In an embodiment, the flat ribbon portion 767 includes a thickness T1 of 2 mm to 3 mm.

In an embodiment, the flat ribbon portion 767 includes a thickness T1 of 3 mm to 10 mm. In an embodiment, the flat ribbon portion 767 includes a thickness T1 of 3 mm to 9 mm. In an embodiment, the flat ribbon portion 767 includes a thickness T1 of 3 mm to 8 mm. In an embodiment, the flat ribbon portion 767 includes a thickness T1 of 3 mm to 7 mm. In an embodiment, the flat ribbon portion 767 includes a thickness T1 of 3 mm to 6 mm. In an embodiment, the flat ribbon portion 767 includes a thickness T1 of 3 mm to 5 mm. In an embodiment, the flat ribbon portion 767 includes a thickness T1 of 3 mm to 4 mm.

In an embodiment, the flat ribbon portion 767 includes a thickness T1 of 4 mm to 10 mm. In an embodiment, the flat ribbon portion 767 includes a thickness T1 of 4 mm to 9 mm. In an embodiment, the flat ribbon portion 767 includes a thickness T1 of 4 mm to 8 mm. In an embodiment, the flat ribbon portion 767 includes a thickness T1 of 4 mm to 7 mm. In an embodiment, the flat ribbon portion 767 includes a thickness T1 of 4 mm to 6 mm. In an embodiment, the flat ribbon portion 767 includes a thickness T1 of 4 mm to 5 mm.

In an embodiment, the flat ribbon portion 767 includes a thickness T1 of 5 mm to 10 mm. In an embodiment, the flat ribbon portion 767 includes a thickness T1 of 5 mm to 9 mm. In an embodiment, the flat ribbon portion 767 includes a thickness T1 of 5 mm to 8 mm. In an embodiment, the flat ribbon portion 767 includes a thickness T1 of 5 mm to 7 mm. In an embodiment, the flat ribbon portion 767 includes a thickness T1 of 5 mm to 6 mm. In an embodiment, the flat ribbon portion 767 includes a thickness T1 of 6 mm to 10 mm. In an embodiment, the flat ribbon portion 767 includes a thickness T1 of 6 mm to 9 mm. In an embodiment, the flat ribbon portion 767 includes a thickness T1 of 6 mm to 8 mm. In an embodiment, the flat ribbon portion 767 includes a thickness T1 of 6 mm to 7 mm. In an embodiment, the flat ribbon portion 767 includes a thickness T1 of 7 mm to 10 mm. In an embodiment, the flat ribbon portion 767 includes a thickness T1 of 7 mm to 9 mm. In an embodiment, the flat ribbon portion 767 includes a thickness T1 of 7 mm to 8 mm. In an embodiment, the flat ribbon portion 767 includes a thickness T1 of 8 mm to 10 mm. In an embodiment, the flat ribbon portion 767 includes a thickness T1 of 8 mm to 9 mm. In an embodiment, the flat ribbon portion 767 includes a thickness T1 of 9 mm to 10 mm.

In an embodiment, the flat ribbon portion 767 includes a thickness T1 of 1 mm. In an embodiment, the flat ribbon portion 767 includes a thickness T1 of 2 mm. In an embodiment, the flat ribbon portion 767 includes a thickness T1 of 3 mm. In an embodiment, the flat ribbon portion 767 includes a thickness T1 of 4 mm. In an embodiment, the flat ribbon portion 767 includes a thickness T1 of 5 mm. In an embodiment, the flat ribbon portion 767 includes a thickness T1 of 6 mm. In an embodiment, the flat ribbon portion 767 includes a thickness T1 of 7 mm. In an embodiment, the flat ribbon portion 767 includes a thickness T1 of 8 mm. In an embodiment, the flat ribbon portion 767 includes a thickness T1 of 9 mm. In an embodiment, the flat ribbon portion 767 includes a thickness T1 of 10 mm.

In an embodiment, the electrical connector 731 includes a thickness T2 of 1 mm to 15 mm. In an embodiment, the electrical connector 731 includes a thickness T2 of 1 mm to 14 mm. In an embodiment, the electrical connector 731 includes a thickness T2 of 1 mm to 13 mm. In an embodiment, the electrical connector 731 includes a thickness T2 of 1 mm to 12 mm. In an embodiment, the electrical connector 731 includes a thickness T2 of 1 mm to 11 mm. In an embodiment, the electrical connector 731 includes a thickness T2 of 1 mm to 10 mm. In an embodiment, the electrical connector 731 includes a thickness T2 of 1 mm to 9 mm. In an embodiment, the electrical connector 731 includes a thickness T2 of 1 mm to 8 mm. In an embodiment, the electrical connector 731 includes a thickness T2 of 1 mm to 7 mm. In an embodiment, the electrical connector 731 includes a thickness T2 of 1 mm to 6 mm. In an embodiment, the electrical connector 731 includes a thickness T2 of 1 mm to 5 mm. In an embodiment, the electrical connector 731 includes a thickness T2 of 1 mm to 4 mm. In an embodiment, the electrical connector 731 includes a thickness T2 of 1 mm to 3 mm. In an embodiment, the electrical connector 731 includes a thickness T2 of 1 mm to 2 mm.

In an embodiment, the electrical connector 731 includes a thickness T2 of 2 mm to 15 mm. In an embodiment, the electrical connector 731 includes a thickness T2 of 2 mm to 14 mm. In an embodiment, the electrical connector 731 includes a thickness T2 of 2 mm to 13 mm. In an embodiment, the electrical connector 731 includes a thickness T2 of 2 mm to 12 mm. In an embodiment, the electrical connector 731 includes a thickness T2 of 2 mm to 11 mm. In an embodiment, the electrical connector 731 includes a thickness T2 of 2 mm to 10 mm. In an embodiment, the electrical connector 731 includes a thickness T2 of 2 mm to 9 mm. In an embodiment, the electrical connector 731 includes a thickness T2 of 2 mm to 8 mm. In an embodiment, the electrical connector 731 includes a thickness T2 of 2 mm to 7 mm. In an embodiment, the electrical connector 731 includes a thickness T2 of 2 mm to 6 mm. In an embodiment, the electrical connector 731 includes a thickness T2 of 2 mm to 5 mm. In an embodiment, the electrical connector 731 includes a thickness T2 of 2 mm to 4 mm. In an embodiment, the electrical connector 731 includes a thickness T2 of 2 mm to 3 mm.

In an embodiment, the electrical connector 731 includes a thickness T2 of 3 mm to 15 mm. In an embodiment, the electrical connector 731 includes a thickness T2 of 3 mm to 14 mm. In an embodiment, the electrical connector 731 includes a thickness T2 of 3 mm to 13 mm. In an embodiment, the electrical connector 731 includes a thickness T2 of 3 mm to 12 mm. In an embodiment, the electrical connector 731 includes a thickness T2 of 3 mm to 11 mm. In an embodiment, the electrical connector 731 includes a thickness T2 of 3 mm to 10 mm. In an embodiment, the electrical connector 731 includes a thickness T2 of 3 mm to 9 mm. In an embodiment, the electrical connector 731 includes a thickness T2 of 3 mm to 8 mm. In an embodiment, the electrical connector 731 includes a thickness T2 of 3 mm to 7 mm. In an embodiment, the electrical connector 731 includes a thickness T2 of 3 mm to 6 mm. In an embodiment, the electrical connector 731 includes a thickness T2 of 3 mm to 5 mm. In an embodiment, the electrical connector 731 includes a thickness T2 of 3 mm to 4 mm.

In an embodiment, the electrical connector 731 includes a thickness T2 of 4 mm to 15 mm. In an embodiment, the electrical connector 731 includes a thickness T2 of 4 mm to 14 mm. In an embodiment, the electrical connector 731 includes a thickness T2 of 4 mm to 13 mm. In an embodiment, the electrical connector 731 includes a thickness T2 of 4 mm to 12 mm. In an embodiment, the electrical connector 731 includes a thickness T2 of 4 mm to 11 mm. In an embodiment, the electrical connector 731 includes a thickness T2 of 4 mm to 10 mm. In an embodiment, the electrical connector 731 includes a thickness T2 of 4 mm to 9 mm. In an embodiment, the electrical connector 731 includes a thickness T2 of 4 mm to 8 mm. In an embodiment, the electrical connector 731 includes a thickness T2 of 4 mm to 7 mm. In an embodiment, the electrical connector 731 includes a thickness T2 of 4 mm to 6 mm. In an embodiment, the electrical connector 731 includes a thickness T2 of 4 mm to 5 mm.

In an embodiment, the electrical connector 731 includes a thickness T2 of 5 mm to 15 mm. In an embodiment, the electrical connector 731 includes a thickness T2 of 5 mm to 14 mm. In an embodiment, the electrical connector 731 includes a thickness T2 of 5 mm to 13 mm. In an embodiment, the electrical connector 731 includes a thickness T2 of 5 mm to 12 mm. In an embodiment, the electrical connector 731 includes a thickness T2 of 5 mm to 11 mm. In an embodiment, the electrical connector 731 includes a thickness T2 of 5 mm to 10 mm. In an embodiment, the electrical connector 731 includes a thickness T2 of 5 mm to 9 mm. In an embodiment, the electrical connector 731 includes a thickness T2 of 5 mm to 8 mm. In an embodiment, the electrical connector 731 includes a thickness T2 of 5 mm to 7 mm. In an embodiment, the electrical connector 731 includes a thickness T2 of 5 mm to 6 mm.

In an embodiment, the electrical connector 731 includes a thickness T2 of 6 mm to 15 mm. In an embodiment, the electrical connector 731 includes a thickness T2 of 6 mm to 14 mm. In an embodiment, the electrical connector 731 includes a thickness T2 of 6 mm to 13 mm. In an embodiment, the electrical connector 731 includes a thickness T2 of 6 mm to 12 mm. In an embodiment, the electrical connector 731 includes a thickness T2 of 6 mm to 11 mm. In an embodiment, the electrical connector 731 includes a thickness T2 of 6 mm to 10 mm. In an embodiment, the electrical connector 731 includes a thickness T2 of 6 mm to 9 mm. In an embodiment, the electrical connector 731 includes a thickness T2 of 6 mm to 8 mm. In an embodiment, the electrical connector 731 includes a thickness T2 of 6 mm to 7 mm.

In an embodiment, the electrical connector 731 includes a thickness T2 of 7 mm to 15 mm. In an embodiment, the electrical connector 731 includes a thickness T2 of 7 mm to 14 mm. In an embodiment, the electrical connector 731 includes a thickness T2 of 7 mm to 13 mm. In an embodiment, the electrical connector 731 includes a thickness T2 of 7 mm to 12 mm. In an embodiment, the electrical connector 731 includes a thickness T2 of 7 mm to 11 mm. In an embodiment, the electrical connector 731 includes a thickness T2 of 7 mm to 10 mm. In an embodiment, the electrical connector 731 includes a thickness T2 of 7 mm to 9 mm. In an embodiment, the electrical connector 731 includes a thickness T2 of 7 mm to 8 mm.

In an embodiment, the electrical connector 731 includes a thickness T2 of 8 mm to 15 mm. In an embodiment, the electrical connector 731 includes a thickness T2 of 8 mm to 14 mm. In an embodiment, the electrical connector 731 includes a thickness T2 of 8 mm to 13 mm. In an embodiment, the electrical connector 731 includes a thickness T2 of 8 mm to 12 mm. In an embodiment, the electrical connector 731 includes a thickness T2 of 8 mm to 11 mm. In an embodiment, the electrical connector 731 includes a thickness T2 of 8 mm to 10 mm. In an embodiment, the electrical connector 731 includes a thickness T2 of 8 mm to 9 mm.

In an embodiment, the electrical connector 731 includes a thickness T2 of 9 mm to 15 mm. In an embodiment, the electrical connector 731 includes a thickness T2 of 9 mm to 14 mm. In an embodiment, the electrical connector 731 includes a thickness T2 of 9 mm to 13 mm. In an embodiment, the electrical connector 731 includes a thickness T2 of 9 mm to 12 mm. In an embodiment, the electrical connector 731 includes a thickness T2 of 9 mm to 11 mm. In an embodiment, the electrical connector 731 includes a thickness T2 of 9 mm to 10 mm.

In an embodiment, the electrical connector 731 includes a thickness T2 of 10 mm to 15 mm. In an embodiment, the electrical connector 731 includes a thickness T2 of 10 mm to 14 mm. In an embodiment, the electrical connector 731 includes a thickness T2 of 10 mm to 13 mm. In an embodiment, the electrical connector 731 includes a thickness T2 of 10 mm to 12 mm. In an embodiment, the electrical connector 731 includes a thickness T2 of 10 mm to 11 mm.

In an embodiment, the electrical connector 731 includes a thickness T2 of 11 mm to 15 mm. In an embodiment, the electrical connector 731 includes a thickness T2 of 11 mm to 14 mm. In an embodiment, the electrical connector 731 includes a thickness T2 of 11 mm to 13 mm. In an embodiment, the electrical connector 731 includes a thickness T2 of 11 mm to 12 mm. In an embodiment, the electrical connector 731 includes a thickness T2 of 12 mm to 15 mm. In an embodiment, the electrical connector 731 includes a thickness T2 of 12 mm to 14 mm. In an embodiment, the electrical connector 731 includes a thickness T2 of 12 mm to 13 mm. In an embodiment, the electrical connector 731 includes a thickness T2 of 13 mm to 15 mm. In an embodiment, the electrical connector 731 includes a thickness T2 of 13 mm to 14 mm. In an embodiment, the electrical connector 731 includes a thickness T2 of 14 mm to 15 mm.

Figure 24:
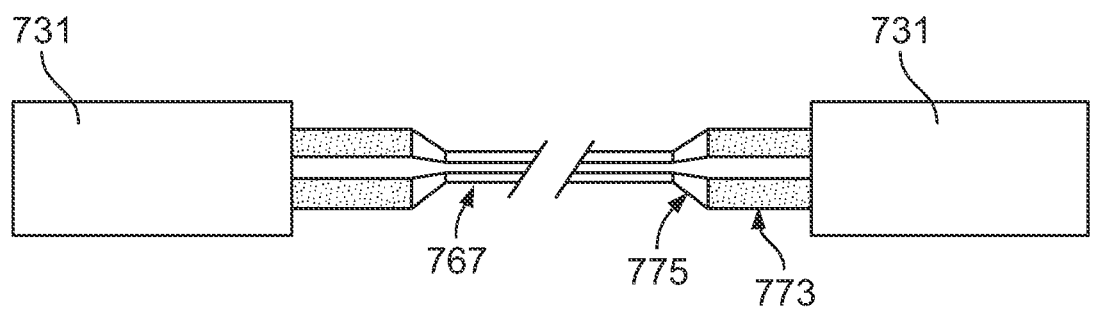
FIG. 24 illustrates an embodiment of an electrical connector.

In an embodiment, the electrical connector 731 includes a thickness T2 of 1 mm. In an embodiment, the electrical connector 731 includes a thickness T2 of 2 mm. In an embodiment, the electrical connector 731 includes a thickness T2 of 3 mm. In an embodiment, the electrical connector 731 includes a thickness T2 of 4 mm. In an embodiment, the electrical connector 731 includes a thickness T2 of 5 mm. In an embodiment, the electrical connector 731 includes a thickness T2 of 6 mm. In an embodiment, the electrical connector 731 includes a thickness T2 of 7 mm. In an embodiment, the electrical connector 731 includes a thickness T2 of 8 mm. In an embodiment, the electrical connector 731 includes a thickness T2 of 9 mm. In an embodiment, the electrical connector 731 includes a thickness T2 of 10 mm. In an embodiment, the electrical connector 731 includes a thickness T2 of 11 mm. In an embodiment, the electrical connector 731 includes a thickness T2 of 12 mm. In an embodiment, the electrical connector 731 includes a thickness T2 of 13 mm. In an embodiment, the electrical connector 731 includes a thickness T2 of 14 mm. In an embodiment, the electrical connector 731 includes a thickness T2 of 15 mm. Referring to FIG. 24, in an embodiment, the flat ribbon portion 767 transitions to a round electrical wire 773, which is integrated with the electrical connector 731. In an embodiment, the flat ribbon portion 767 is overmolded with the round electrical wire 773, forming an overmolded portion 775. In an embodiment, the round electrical wire 773 includes a diameter D1 of 1 mm to 10 mm.

It should be understood that the embodiments described herein are merely exemplary and that a person skilled in the art may make many variations and modifications without departing from the spirit and scope of the invention. All such variations and modifications are intended to be included within the scope of the invention.

What is claimed is:

1. A system, comprising:
a roof deck;
a plurality of photovoltaic modules installed on the roof deck, wherein each of the plurality of photovoltaic modules includes at least one solar cell having an electrical bussing,
an encapsulant encapsulating the at least one solar cell,
wherein the encapsulant includes a first surface having at least one first opening, and
a frontsheet juxtaposed with the first surface of the encapsulant,
wherein the frontsheet includes a first surface, a second surface opposite the first surface of the frontsheet, and at least one second opening extending from the first surface of the frontsheet to the second surface of the frontsheet,
wherein the first surface of the frontsheet is the uppermost surface of the photovoltaic module opposite the roof deck,
wherein the at least one second opening of the frontsheet is in fluid communication with the at least one first opening of the encapsulant, and wherein the electrical bussing is positioned in the at least one first opening;
at least one electrical wire having a first end connected to the electrical bussing of the at least one solar cell, wherein the at least one electrical wire is positioned in the at least one second opening of the front sheet; and
at least one cover attached to the first surface of the frontsheet and covering the first end of the at least one electrical wire and the at least one first opening and the at least one second opening.

2. The system of claim 1, wherein the encapsulant includes a first layer and a second layer, wherein the at least one first opening is formed within the first layer.

3. The system of claim 1, wherein the at least one cover includes a first surface, a second surface opposite the first surface of the at least one cover, a first edge, a second edge opposite the first edge, at least one channel formed within the second surface of the at least one cover, wherein the at least one channel is sized and shaped to receive the at least one electrical wire, and a first aperture formed within the first edge, wherein a first channel of the at least one channel extends from the first aperture to a location intermediate the first edge and the second edge.

4. The system of claim 3, wherein the at least one channel includes a plurality of channels, wherein the at least one cover incudes a second aperture, and wherein a second channel of the plurality of channels extends from the second aperture to a location intermediate the first edge and the second edge.

5. The system of claim 4, wherein the at least one cover includes a third edge extending from the first edge to the second edge, a fourth edge opposite the third edge and extending from the first edge to the second edge, a third aperture formed within the third edge, and a fourth aperture formed within the fourth edge, wherein a third channel of the plurality of channels extends from the third aperture to a location intermediate the third edge and the fourth edge, and wherein a fourth channel of the plurality of channels extends from the fourth aperture to a location intermediate the third edge and the fourth edge.

* * * * *